(12) United States Patent
Izumi et al.

(10) Patent No.: US 7,182,821 B2
(45) Date of Patent: Feb. 27, 2007

(54) SUBSTRATE PROCESSING METHOD AND SUBSTRATE PROCESSING APPARATUS

(75) Inventors: Akira Izumi, Kyoto (JP); Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 574 days.

(21) Appl. No.: 10/413,608

(22) Filed: Apr. 14, 2003

(65) Prior Publication Data

US 2003/0196683 A1 Oct. 23, 2003

(30) Foreign Application Priority Data

Apr. 19, 2002 (JP) .............................. 2002-118129
Feb. 25, 2003 (JP) .............................. 2003-047855

(51) Int. Cl.
*B08B 3/00* (2006.01)

(52) U.S. Cl. .............................. 134/36; 134/2; 134/32; 134/33; 134/34; 216/90; 216/91; 438/906

(58) Field of Classification Search ................... 134/2, 134/32, 33, 34, 36; 216/90, 91; 438/906
See application file for complete search history.

(56) References Cited

U.S. PATENT DOCUMENTS 5,608,943 A * 3/1997 Konishi et al. ............... 15/302

6,485,576 B1 * 11/2002 Huang et al. .................. 134/2
2003/0073320 A1 * 4/2003 Emami ........................ 438/704

FOREIGN PATENT DOCUMENTS

| JP | 9-141191 | * | 6/1997 |
| JP | 9-293715 | * | 11/1997 |
| JP | 09-330904 | | 12/1997 |
| JP | 2000-91212 | * | 3/2000 |
| JP | 2002-110626 | | 4/2002 |

* cited by examiner

*Primary Examiner*—M. Kornakov
(74) *Attorney, Agent, or Firm*—Ostrolenk, Faber, Gerb & Soffen, LLP

(57) ABSTRACT

Disclosed is a substrate processing method including a substrate rotating step for rotating a substrate with the substrate held almost horizontally within a chamber; a peripheral edge processing step for discharging a processing liquid to a lower surface of the substrate rotated in the substrate rotating step and causing the processing liquid to flow around an upper surface of the substrate at a peripheral edge thereof from the lower surface of the substrate to process the peripheral edge of the upper surface of the substrate in the chamber; and a both-surface processing step for discharging the processing liquid to both the surfaces of the substrate rotated in the substrate rotating step to process both the surfaces of the substrate in the chamber.

14 Claims, 11 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus, in which a peripheral edge of a substrate such as a substrate for a semiconductor wafer, a substrate for an optical disk, a substrate for a magnetic disk, or a substrate for a magnetooptic disk can be subjected to processing using a processing liquid.

2. Description of the Related Art

In the steps of manufacturing a semiconductor device, so-called bevel etching for rotating a semiconductor wafer (hereinafter merely referred to as "wafer") having a thin film formed on its one surface with the wafer held approximately horizontally, supplying an etchant to the other surface of the wafer, and causing a part of the etchant to flow around to the one surface at a peripheral edge of the wafer to etch a peripheral edge of the thin film is carried out.

FIGS. 11(a), 11(b), and 11(c) are schematic cross-sectional views for explaining a conventional method of bevel etching.

A wafer W to be processed has a thin film F such as a metal film, for example, formed from its one surface to its end surface (peripheral surface), and particles P produced at the time of forming the thin film F adhere to a surface of the thin film F.

First, the wafer W is held approximately horizontally with the surface on which the thin film F is formed directed upward, and is rotated around its central axis C. An etchant L is discharged toward the vicinity of the center of a lower surface of the wafer W. The etchant L expands along the lower surface of the wafer W by a centrifugal force caused by the rotation of the wafer W, to be spun off sideward at a peripheral edge of the wafer W. Each of the surfaces of the wafer W and the thin film F has a wettability with the etchant L. Accordingly, a part of the etchant L flows around to the upper surface of the wafer W at the peripheral edge thereof (see FIG. 11(a)). Consequently, the thin film F on the end surface of the wafer W and at the peripheral edge of the upper surface thereof is etched away.

Thereafter, deionized water D is supplied from the center of the lower surface of the wafer W, thereby cleaning the lower surface of the wafer W. At this time, a part of the deionized water D flows around to the peripheral edge of the upper surface of the wafer W as at the time of etching (see FIG. 11(c)). Consequently, the end surface of the wafer W and the peripheral edge of the upper surface thereof are also cleaned.

However, the following problems occur in such a method.

The first problem is that contaminants caused by processing with the etchant L are produced at the peripheral edge of the wafer W. The wettability of the thin film F with the etchant L differs from the wettability of the wafer W with the etchant L. For example, even if the thin film F has a suitable wettability with the etchant L, the exposed wafer W may, in some cases, have water repellency to the etchant L. When the thin film F is removed by etching, therefore, a width along which the etchant L flows around to the upper surface of the wafer W may, in some cases, be reduced.

In a region where the width along which the etchant L flows around to the upper surface of the wafer W is reduced (hereinafter referred to as "retreat region") B, an etching residue R is produced. Further, a crystallized product S obtained by crystallizing a component of the etchant L may, in some cases, be produced in the retreat region B (see FIG. 11(b)). The etching residue R and the crystallized product S may cause particle contamination and metal contamination, to contaminate another apparatus or cause a device obtained from the wafer W to develop a fault.

The second problem is that it is difficult to completely remove such contaminants produced in the retreat region B of the wafer W. When an attempt to remove the etching residue R and the crystallized product S by cleaning processing, a cleaning liquid must be efficiently supplied to the retreat region B.

Particularly when the surface of the wafer W is a hydrophobic (water-repellent) surface, however, the retreat region B (the exposed wafer W) may, in many cases, have a low wettability with not only the etchant L but also the cleaning liquid such as the deionized water D. Even if the cleaning liquid is supplied from the reverse surface of the wafer W, therefore, the cleaning liquid does not flow around to all portions of the retreat region B.

It is possible to adjust an amount in which the cleaning liquid flows around to the upper surface of the wafer W by changing conditions such as the number of revolutions of the wafer W. Even by such a method, however, it is difficult to completely remove the etching residue R and the crystallized product S. In order to completely remove the etching residue R and the crystallized product S, a long time period is required to clean the wafer W.

When an attempt to efficiently supply the cleaning liquid to the retreat region B is made, because the step of removing the etching residue R and the crystallized product S must be carried out using an apparatus other than an apparatus for performing etching processing, the whole step is complicated.

The third problem is that the cross-sectional shape of a peripheral edge of the thin film F is rounded. Even if the supply of the etchant L to the wafer W is stopped upon completion of the etching processing, a part of the etchant L remains at the peripheral edge of the wafer W, an end of the thin film F, and so on. In this state, when the deionized water D is supplied to the lower surface of the wafer W by adjusting the conditions such that an amount in which the deionized water D flows around to the upper surface of the wafer W is increased, the deionized water D flows around to the upper surface of the wafer W while dissolving the etchant L at the peripheral edge of the wafer W.

Therefore, a front end (a portion in contact with the thin film F, which is indicated by hatching in FIG. 11(c)) J of the deionized water D flowing around to the upper surface of the wafer W contains the etchant L at a high concentration. Therefore, the peripheral edge of the thin film F is etched, so that the cross-sectional shape of the peripheral edge of the thin film F is rounded.

The fourth problem is that the contaminants such as the particles P adhering to the surface of the thin film F cannot be removed. In the above-mentioned method, the deionized water (cleaning liquid) is not supplied to a large part, on the upper surface of the thin film F, of the wafer W. Accordingly, the particles P on the thin film F remain without being removed. In order to remove the particles P, the wafer W must be cleaned by another apparatus before or after the bevel etching is carried out.

SUMMARY OF THE INVENTION

A first object of the present invention is to provide a substrate processing method in which contaminants on a substrate can be simply removed before or after processing of a peripheral edge of the substrate.

A second object of the present invention is to provide a substrate processing method in which peripheral edge processing for supplying a processing liquid from one surface of a substrate to process a peripheral edge of the substrate and cleaning of the other surface of the substrate using a cleaning liquid can be simply performed.

A third object of the present invention is to provide a substrate processing apparatus capable of simply removing contaminants on a substrate before or after processing of a peripheral edge of the substrate.

A fourth object of the present invention is to provide a substrate processing apparatus capable of simply performing peripheral edge processing for supplying a processing liquid from one surface of a substrate to process a peripheral edge of the substrate and processing of the other surface of the substrate using the processing liquid.

A substrate processing method according to the present invention comprises a substrate rotating step for rotating a substrate (W) with the substrate held almost horizontally within a chamber (21); a peripheral edge processing step for discharging a processing liquid (L) to a lower surface of the substrate rotated in the substrate rotating step and causing the processing liquid to flow around to an upper surface of the substrate at a peripheral edge thereof from the lower surface of the substrate to process the substrate in the chamber; and a both-surface processing step for discharging a processing liquid (D, D0, D1) to both the surfaces of the substrate rotated in the substrate rotating step to process both the surfaces of the substrate in the chamber.

Although alphanumeric characters in parentheses indicate corresponding constituent elements and the like in embodiments, described later, it is not intended that the present invention should be interpreted by being limited to the embodiments (the same is true in the following).

According to the present invention, peripheral edge processing for supplying the processing liquid to the lower surface of the substrate to process the peripheral edge of the substrate and both-surface processing for supplying the processing liquid to both the surfaces of the substrate to process both the surfaces of the substrate can be performed within the same chamber, that is, by one apparatus. Consequently, the two types of processing can be performed simply and in a short time period.

The processing liquid used in the peripheral edge processing step may be a chemical such as an etchant, for example. When the etchant is used as the processing liquid, so-called bevel etching for etching a peripheral edge of the other surface of the substrate can be carried out. The processing liquid used in the both-surface processing step may be a cleaning liquid, for example. In this case, the substrate can be cleaned. The substrate may be a circular substrate such as a semiconductor wafer.

The both-surface processing step may comprise a post-cleaning step for discharging a cleaning liquid (D, D0, D1) to both the surfaces of the substrate rotated in the substrate rotating step to clean the substrate after the peripheral edge processing step.

According to this configuration, the cleaning liquid is supplied to both the surfaces of the substrate. Accordingly, contaminants (when the processing liquid is the etchant, for example, an etching residue or a crystallized product obtained by crystallizing a component of the etchant) produced as the peripheral edge processing is performed are removed in a short time period by the cleaning liquid even when they exist in any part of the substrate.

In a case where the peripheral edge processing step is a bevel etching step, for example, when the supply of the etchant is stopped, a part of the etchant remains at the peripheral edge of the substrate, the end of the thin film formed on the surface of the substrate, or the like. The etchant is instantaneously removed by the cleaning liquid supplied to both surfaces of the substrate in the post-cleaning step subsequently carried out. Consequently, the cleaning liquid containing the etchant at a high concentration is not brought into contact with the thin film for a long time, thereby making it possible to prevent a cross-sectional shape at an end of a portion, which is not etched, of the thin film from being rounded.

Furthermore, in the post-cleaning step, the other surface of the substrate is cleaned by the cleaning liquid. Even when contaminants such as particles adhere on the other surface of the substrate (on the thin film formed on the other surface of the substrate, for example), therefore, the contaminants can be removed. Cleaning for removing the contaminants such as the particles and cleaning for removing the contaminants caused by the peripheral edge processing and the chemical itself may be separate steps. In this case, a cleaning liquid for removing the contaminants such as the particles (a particle removing liquid) and a cleaning liquid for removing the contaminants caused by the peripheral edge processing and the chemical itself may differ in type.

The post-cleaning step may comprise a preliminary cleaning step for discharging a preliminary cleaning liquid (D1) to the substrate to clean the substrate, and a deionized water cleaning step for discharging deionized water (D) to the substrate to clean the substrate after the preliminary cleaning step.

According to this configuration, the preliminary cleaning liquid used in the preliminary cleaning step can be removed in the deionized water cleaning step after the contaminants caused by the peripheral edge processing are removed by the preliminary cleaning liquid in the preliminary cleaning step.

The preliminary cleaning liquid can be a chemical having a low concentration (e.g., one of the same type as the chemical used in the peripheral edge processing step), for example. Consequently, the contaminants caused by the peripheral edge processing can be quickly removed.

The both-surface processing step may comprise a pre-cleaning step for discharging a cleaning liquid (D0) to both the surfaces of the substrate rotated in the substrate rotating step to clean the substrate before the peripheral edge processing step.

The other surface of the substrate may be cleaned in not the post-cleaning step but the pre-cleaning step.

The substrate (W) processed in the peripheral edge processing step and the both-surface processing step may include a substrate (W) having a metal thin film (Fm) formed on its one surface and its end surface.

In this case, the substrate is held and rotated with a surface on which the metal thin film is formed directed upward in the substrate rotating step, and a suitable etchant is discharged onto the lower surface of the substrate in the peripheral edge processing step, thereby making it possible to remove the metal thin film on the end surface (peripheral surface) of the substrate and at the peripheral edge of the upper surface thereof.

A substrate processing apparatus (10, 30, 40, 50, 60) according to the present invention comprises a chamber (21); a substrate rotating mechanism (1, 5) disposed in the chamber for rotating a substrate (W) with the substrate held almost horizontally; a lower surface processing liquid discharge nozzle (8, 61, 62, 63) disposed in the chamber for discharging a processing liquid (L, D, D0, D1) toward a lower surface of the substrate rotated by the substrate rotating mechanism; an upper surface processing liquid discharge nozzle (18, 34, 41, 42, 43, 51, 52, 53) disposed in the chamber for discharging a processing liquid (D, D0, D1) toward an upper surface of the substrate rotated by the substrate rotating mechanism; and a discharge control section (20) for selectively switching, when the substrate is rotated by the substrate rotating mechanism, a peripheral edge processed state where the processing liquid (L) is discharged from the lower surface processing liquid discharge nozzle to process a peripheral edge of the substrate and a both-surface processed state where the processing liquids (D, D0, D1) are simultaneously discharged from the lower surface processing liquid discharge nozzle and the upper surface processing liquid discharge nozzle to process both the surfaces of the substrate, to control the discharge.

The substrate rotating mechanism (1) may comprise a spin base (58a) arranged almost horizontally in a disk shape, and a plurality of chuck pins (3) provided in a standing condition at a peripheral edge of an upper surface of the spin base for holding the substrate.

The lower surface processing liquid discharge nozzle may include a nozzle (8, 61, 62, 63) for discharging the processing liquid toward the center of the lower surface of the substrate held in the substrate rotating mechanism. Further, the upper surface processing liquid discharge nozzle may include a nozzle (18, 41, 42, 43, 51, 52, 53) for discharging the processing liquid toward the center of the upper surface of the substrate held in the substrate rotating mechanism.

When the substrate is rotated by the substrate rotating mechanism, the processing liquid supplied to the center of the lower surface of the substrate or the center of the upper surface thereof expands toward the peripheral edge of the lower surface of the substrate or the peripheral edge of the upper surface of the substrate by a centrifugal force, thereby making it possible to process the whole of the lower surface or the upper surface of the substrate by the processing liquid.

There may be provided a plurality of lower processing liquid discharge nozzles and/or a plurality of upper processing liquid discharge nozzles. When the plurality of upper surface (lower surface) processing liquid discharge nozzles are provided, the same type of processing liquid may be simultaneously dischargeable from the upper surface (lower surface) processing liquid discharge nozzles. In this case, the upper surface (lower surface) processing liquid discharge nozzles may be respectively directed toward different regions with respect to the radial direction of the substrate held in the substrate rotating mechanism. In this case, it can be assumed that at least one of the upper surface (lower surface) processing liquid discharge nozzles is directed toward the vicinity of the center of the substrate held in the substrate rotating mechanism.

The upper surface processing liquid discharge nozzle may further include an auxiliary nozzle (34) for discharging the processing liquid toward the peripheral edge of the upper surface of the substrate held in the substrate rotating mechanism in addition to the nozzle for discharging the processing liquid toward the center of the upper surface of the substrate held in the substrate rotating mechanism.

The auxiliary nozzle can be opposable to the vicinity of the region to which the processing liquid discharged from the lower surface processing liquid discharge nozzle flows around in the vicinity of the peripheral edge of the upper surface of the substrate. In this case, the contaminants produced as the peripheral edge processing is performed can be removed quickly and reliably.

Furthermore, the plurality of upper surface (lower surface) processing liquid discharge nozzles may be provided, and different types of processing liquids may be respectively dischargeable for the upper surface (lower surface) processing liquid discharge nozzles. In this case, it can be assumed that the upper surface (lower surface) processing liquid discharge nozzles are respectively connected to processing liquid supply sources containing different types of processing liquids, and the processing liquids contained in the processing liquid supply sources are respectively supplied to the upper surface (lower surface) processing liquid discharge nozzles along dedicated flow paths. That is, the upper surface (lower surface) processing liquid discharge nozzles can be configured such that there exist no flow paths used in common by the different types of processing liquids. In this case, each of the upper surface (lower surface) processing liquid discharge nozzles shall be directed toward the vicinity of the center of the substrate held in the substrate rotating mechanism.

When there are two lower surface processing liquid discharge nozzles, one of the lower surface processing liquid discharge nozzles may be one capable of discharging a chemical, and the other lower surface processing liquid discharge nozzle may be one capable of discharging a cleaning liquid, for example.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
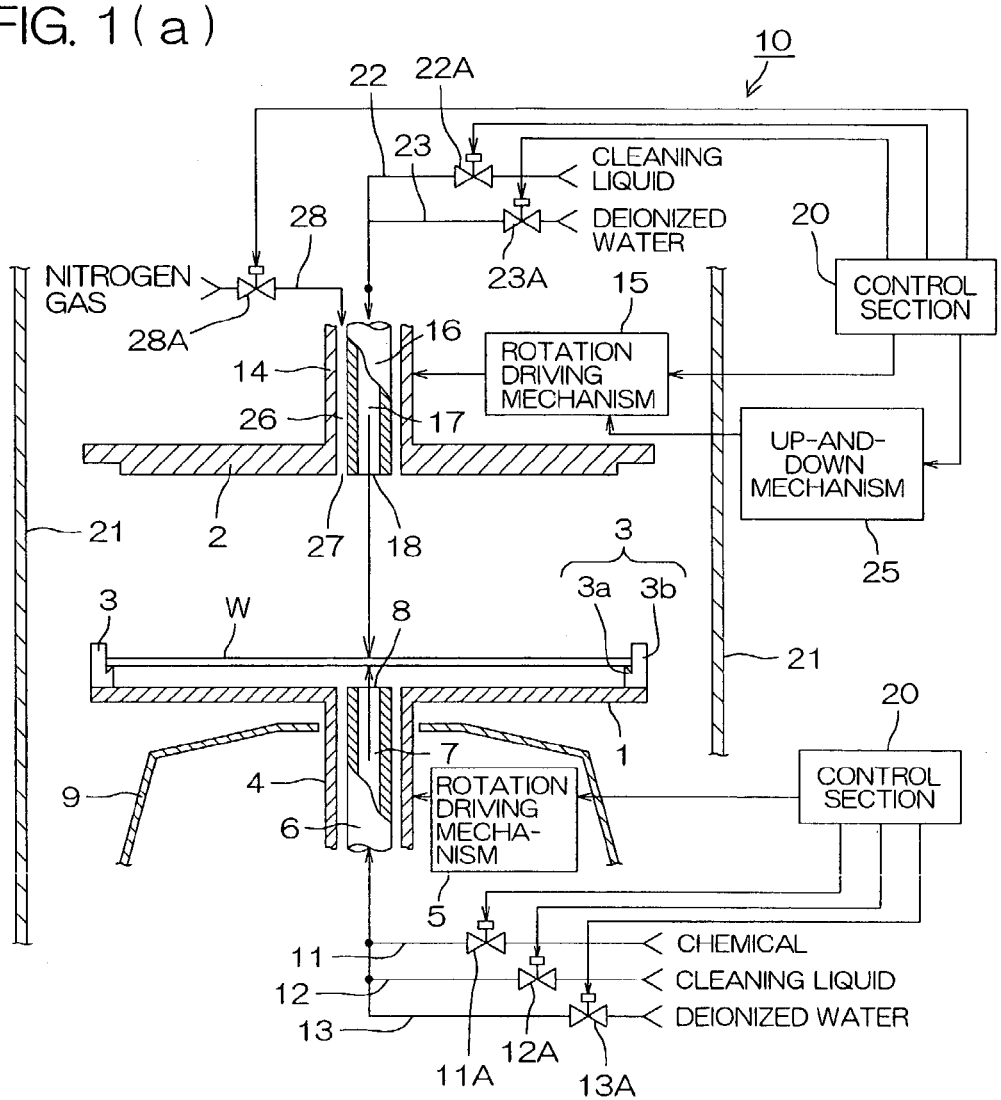
FIG. 1(a) is a schematic cross-sectional view showing the configuration of a substrate processing apparatus according to a first embodiment of the present invention, which illustrates a state where a shielding plate is at a distant position.
Figure 1B:
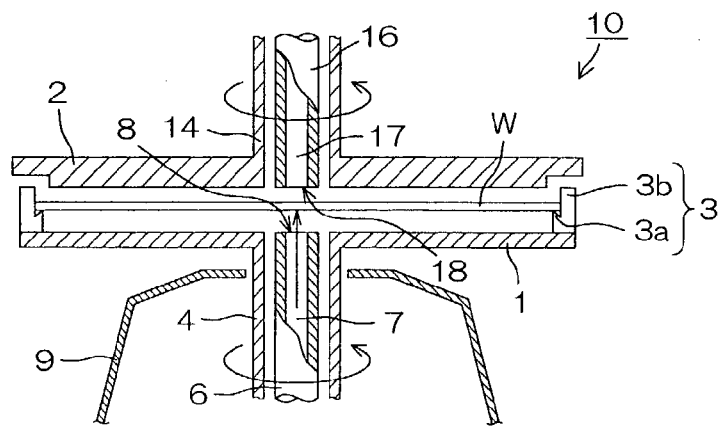
FIG. 1(b) is a schematic cross-sectional view showing the configuration of the substrate processing apparatus according to the first embodiment of the present invention, which illustrates a state where the shielding plate is at a proximal position.

FIGS. 1(a) and 1(b) are schematic cross-sectional views showing the configuration of a substrate processing apparatus 10 according to an embodiment of the present invention.

The substrate processing apparatus 10 comprises a chamber 21, a spin chuck 1 disposed in the chamber 21 comprising a disk-shaped spin base rotated with a semiconductor wafer (hereinafter merely referred to as a "wafer") W, which is an example of a substrate, held almost horizontally, and a shielding plate 2 disposed in the chamber 1 and disposed above the spin chuck 1. A plurality of chuck pins 3 are provided in a standing condition at a peripheral edge of an upper surface of the spin base in the spin chuck 1. The chuck pin 3 has a supporting section 3a for supporting a peripheral edge of a lower surface of the wafer W and a holding section 3b for holding an end surface (peripheral surface) of the wafer W. The wafer W can be held by supporting section 3a in the spin chuck 1 with the lower surface of the wafer W opened.

The spin chuck 1 has a rotating shaft 4 disposed along a vertical direction, and a rotation driving force is applied to the rotating shaft 4 from a rotation driving mechanism 5. The wafer W held in the spin chuck 1 can be rotated by the rotation driving mechanism 5. A protecting member 9 is disposed around the rotating shaft 4 so that the rotating shaft 4 and the rotation driving mechanism 5 can be protected from a chemical or the like.

The rotating shaft 4 is in a tubular shape, and a lower processing liquid pipe 6 is inserted into the rotating shaft 4. A processing liquid supply path 7 is provided inside the lower processing liquid pipe 6. An upper part of the processing liquid supply path 7 is a lower nozzle 8 opened in the vicinity of the center of an upper surface of the spin chuck 1.

A lower end of the lower processing liquid pipe 6 is branched into a chemical pipe 11, a cleaning liquid pipe 12, and a deionized water pipe 13. The chemical pipe 11 is connected to a chemical supply source containing a chemical, the cleaning liquid pipe 12 is connected to a cleaning liquid supply source containing a cleaning liquid, and the deionized water pipe 13 is connected to a deionized water supply source containing deionized water. A valve 11A is interposed in the chemical pipe 11, a valve 12A is interposed in the cleaning liquid pipe 12, and a valve 13A is interposed in the deionized water pipe 13. The chemical, the cleaning liquid, and the deionized water can be switched, introduced into the processing liquid supply path 7, and discharged from the lower nozzle 8 by opening or closing the valves 11A, 12A, and 13A.

The shielding plate 2 is a disk-shaped member having approximately the same diameter as that of the spin chuck 1, and is arranged almost horizontally. The shielding plate 2 has a rotating shaft 14 arranged along a vertical direction, and a rotation driving force is applied to the rotating shaft 14 from a rotation driving mechanism 15. The shielding plate 2 can be rotated in the same rotation direction and at the same revolutions as those of the spin chuck 1 rotated by the rotation driving mechanism 5.

The rotating shaft 14 is in a tubular shape, and an upper processing liquid pipe 16 is inserted into the rotating shaft 14. A processing liquid supply path 17 is provided inside the upper processing liquid pipe 16. A lower part of the processing liquid supply path 17 is an upper nozzle 18 opened in the vicinity of the center of a lower surface of the shielding plate 2.

An upper end of the upper processing liquid pipe 16 is branched into a cleaning liquid pipe 22 and a deionized water pipe 23. The cleaning liquid pipe 22 is connected to a cleaning liquid supply source containing a cleaning liquid, and the deionized water pipe 23 is connected to a deionized water supply source containing deionized water. A valve 22A is interposed in the cleaning liquid pipe 22, and a valve 23A is interposed in the deionized water pipe 23. The cleaning liquid and the deionized water can be switched, introduced into the processing liquid supply path 17, and discharged from the upper nozzle 18 by opening or closing the valves 22A and 23A.

The cleaning liquid supply source connected to the cleaning liquid pipe 12 and the cleaning liquid supply source connected to the cleaning liquid pipe 22 can be the same when the cleaning liquids respectively contained therein are the same. The deionized water supply source connected to the deionized water pipe 13 and the deionized water supply source connected to the deionized water pipe 23 may be the same.

A space between the upper processing liquid pipe 16 and an inner wall of the rotating shaft 14 is a nitrogen gas supply path 26, and a lower end of the nitrogen gas supply path 26 is a nitrogen gas discharge port 27 opened in the vicinity of the center of a lower surface of the shielding plate 2. A nitrogen gas pipe 28 connected to a nitrogen gas supply source is communicated to the nitrogen gas supply path 26 in an upper part of the rotating shaft 14. A valve 28A is interposed in the nitrogen gas pipe 28. It is possible to introduce nitrogen gas into the nitrogen gas supply path 26 by opening the valve 28A and to discharge the nitrogen gas from the nitrogen gas discharge port 27.

The shielding plate 2 is raised or lowered by an up-and-down mechanism 25, and can be moved between a distant position (see FIG. 1(*a*)) where it is distant from the wafer W held in the spin chuck 1 and a proximal position (see FIG. 1(*b*)) where it is in close proximity to the wafer W held in the spin chuck 1.

The opening or closing of the valves 11A to 13A, 22A, 23A, and 28A, the operations of the rotation driving mechanisms 5 and 15, and the operation of the up-and-down mechanism 25 are controlled by a control section 20.

By the above-mentioned configuration, the substrate processing apparatus 10 can perform peripheral edge processing for supplying the chemical from the lower surface of the wafer W rotated with the wafer W held in the spin chuck 1 to process the peripheral edge of the wafer W and cleaning of the upper surface and the lower surface of the wafer W by the cleaning liquid or the deionized water within the same chamber 21, that is, by one apparatus. Consequently, the two types of processing can be simply performed.

Figure 2A:
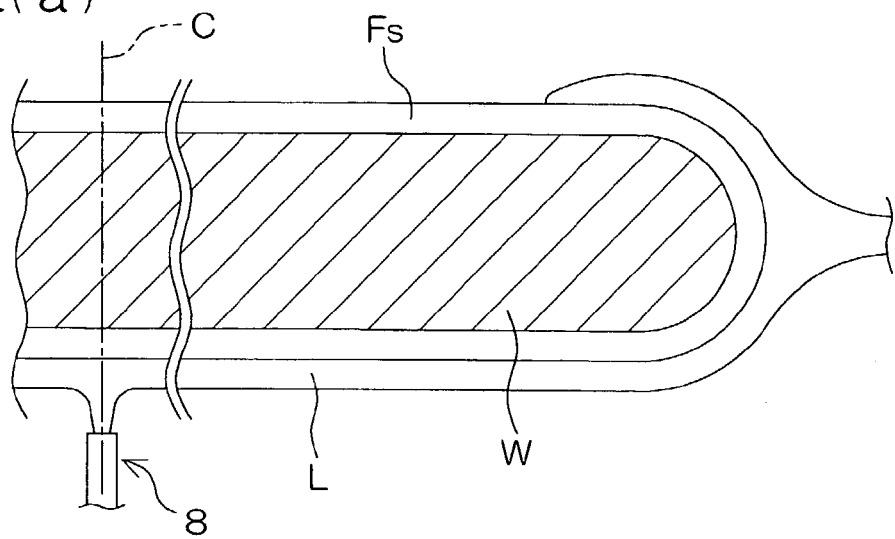
FIG. 2(a) is a schematic cross-sectional view for explaining a wafer processing method according to a first embodiment using the substrate processing apparatus shown in FIGS. 1(a) and 1(b)
Figure 2B:
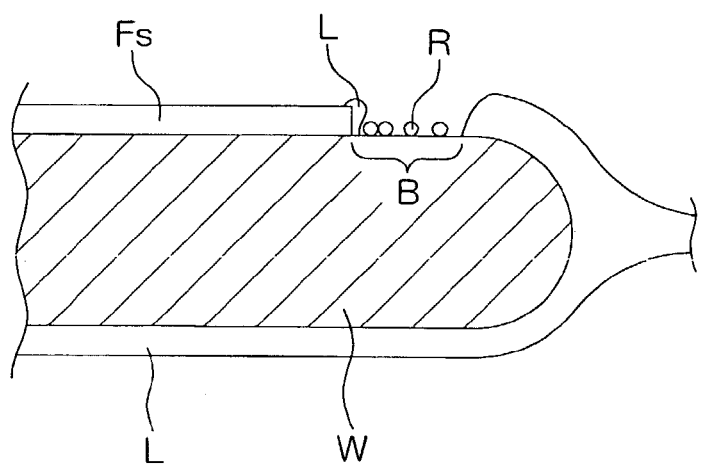
FIG. 2(b) is a schematic cross-sectional view for explaining the wafer processing method according to the first embodiment using the substrate processing apparatus shown in FIGS. 1(a) and 1(b)
Figure 2C:
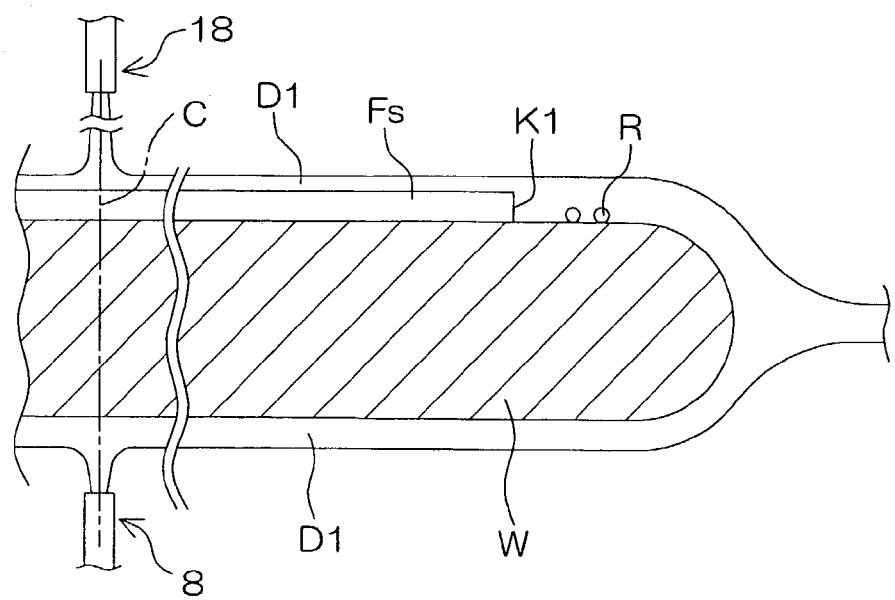
FIG. 2(c) is a schematic cross-sectional view for explaining the wafer processing method according to the first embodiment using the substrate processing apparatus shown in FIGS. 1(a) and 1(b)

FIGS. 2(*a*) to 2(*c*) are schematic cross-sectional views for explaining a wafer processing method according to a first embodiment using the substrate processing apparatus shown in FIGS. 1(*a*) and 1(*b*). In the wafer processing method, it is possible to remove, in a wafer having a thin film formed on both its surfaces, the thin film on the one surface of the wafer and at a peripheral edge of the other surface thereof by bevel etching.

A thin film Fs composed of silicon oxide (SiO$_2$) or silicon nitride (SiN) is formed on both surfaces and an end surface (peripheral surface) of a wafer W. The chemical supply source contains a hydrofluoric acid solution having a high concentration as an etchant, and both the cleaning liquid supply sources respectively connected to the cleaning liquid pipes 12 and 22 contain a hydrofluoric acid solution having a low concentration as a preliminary cleaning liquid.

First, all the valves 11A to 13A, 22A, 23A, and 28A are brought into a closed state under control of the control section 20, and the up-and-down mechanism 25 is controlled by the control section 20 so that the shielding plate 2 is moved to the distant position. The wafer W is delivered to the spin chuck 1 by a robot hand (not shown), and is held almost horizontally on the spin chuck 1. By the control section 20, the up-and-down mechanism 25 is controlled so that the shielding plate 2 is moved to the proximal position, and the rotation driving mechanisms 5 and 15 are controlled so that the wafer W held in the spin chuck 1 and the shielding plate 2 are rotated around a central axis C of the wafer W.

Subsequently, the valve 28A is opened under control of the control section 20, so that nitrogen gas is discharged from the nitrogen gas discharge port 27. Accordingly, oxygen partial pressure in a space between the spin chuck 1 and the shielding plate 2 is reduced.

In this state, the valve 11A is opened under control of the control section 20, so that an etchant L is discharged toward the vicinity of the center of the lower surface of the wafer W from the lower nozzle 8. The etchant L expands along the lower surface of the wafer W by a centrifugal force caused by the rotation of the wafer W, to be spun off sideward at the peripheral edge of the wafer W. The surface of the thin film Fs has a wettability with the etchant L. Accordingly, a part of the etchant L flows around to the upper surface of the wafer W at the peripheral edge thereof (see FIG. 2(*a*)). Consequently, the thin film Fs on the lower surface and the end surface (peripheral surface) of the wafer W and at the peripheral edge of the upper surface thereof is etched away.

The wettability of a portion, which is exposed because the thin film Fs is removed, of the wafer W with the etchant L is lower than the wettability of the thin film Fs with the etchant L. When the thin film Fs at the peripheral edge of the upper surface of the wafer W is removed, therefore, a width along which the etchant L flows around to the upper surface of the wafer W is reduced. In a region (hereinafter referred to as a "retreat region") B where the width along which the etchant L flows around to the upper surface of the wafer W is reduced, an etching residue R is produced (see FIG. 2(*b*)).

The valves 11A and 28A are then closed under control of the control section 20, so that the supply of the etchant L and the nitrogen gas is stopped. In this state, the etchant L remains at the peripheral edge of the wafer W and in the vicinity of an end of the thin film Fs. Thereafter, by the control section 20, the up-and-down mechanism 25 is controlled so that the shielding plate 2 is moved to the distant position, and the rotation driving mechanism 15 is controlled so that the rotation of the shielding plate 2 is stopped.

Subsequently, the valves 12A and 22A are opened under control of the control section 20, so that a preliminary cleaning liquid D1 is discharged toward the lower surface and the upper surface of the wafer W, respectively, from the lower nozzle 8 and the upper nozzle 18. The preliminary cleaning liquid D1 expands along the lower surface and the upper surface of the wafer W, to be spun off sideward at the peripheral edge of the wafer W. In this case, by the preliminary cleaning liquid D1, the etchant L remaining at the peripheral edge of the wafer W and in the vicinity of the end of the thin film Fs is instantaneously removed, and the etching residue R produced in the retreat region B is easily removed (see FIG. 2(*c*)).

Then, under control of the control section 20, the valves 12A and 22A are closed, and the valves 13A and 23A are opened, so that deionized water is discharged toward the lower surface and the upper surface of the wafer W, respectively, from the lower nozzle 8 and the upper nozzle 18. Consequently, the preliminary cleaning liquid D1 on the wafer W is removed. After the deionized water is discharged for a predetermined time period, the valves 13A and 23A are closed under control of the control section 20.

Thereafter, the rotation driving mechanism 5 is controlled by the control section 20, so that the wafer W held in the spin chuck 1 is rotated at high speed, to be spun off and dried. The processing of one wafer W is thus terminated.

In the foregoing method of processing the wafer W, the etching residue R produced as the etching processing is performed is simply removed by the preliminary cleaning liquid D1. Therefore, the wafer W can be cleaned in a short time period after the etching processing.

After the supply of the etchant L is stopped, the etchant L remaining on the wafer W is instantaneously removed by the preliminary cleaning liquid D1 supplied to the lower surface and the upper surface of the wafer W. Consequently, a hydrofluoric acid solution having a high concentration is not brought into contact with the thin film Fs for a long time. Accordingly, the thin film Fs formed on the surface of the wafer W can be etched such that the cross-sectional shape of an end K1 after the etching is not rounded.

Figure 3A:
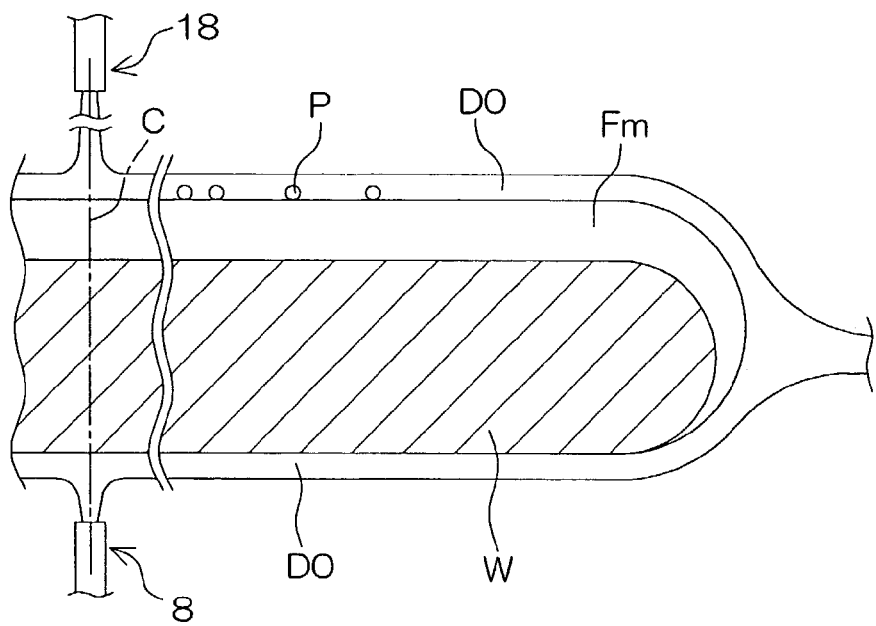
FIG. 3(a) is a schematic cross-sectional view for explaining a wafer processing method according to a second embodiment using the substrate processing apparatus shown in FIGS. 1(a) and 1(b)
Figure 3B:
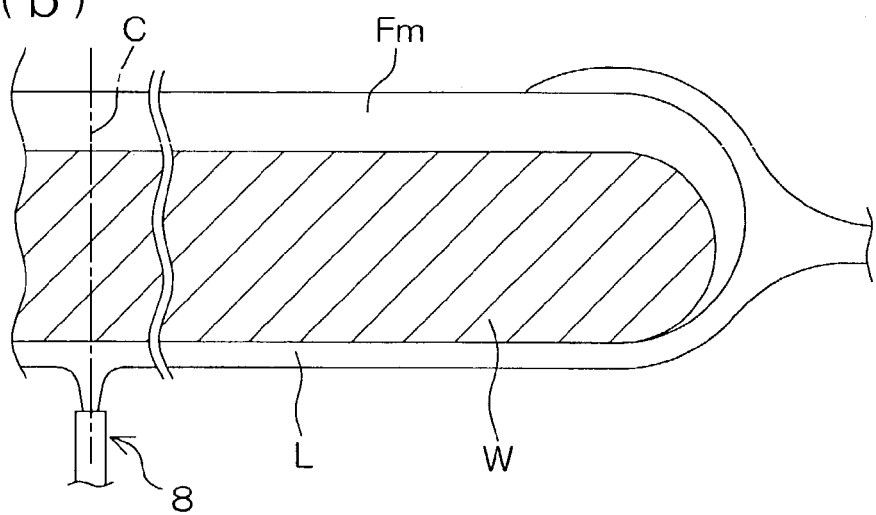
FIG. 3(b) is a schematic cross-sectional view for explaining the wafer processing method according to the second embodiment using the substrate processing apparatus shown in FIGS. 1(a) and 1(b)
Figure 3C:
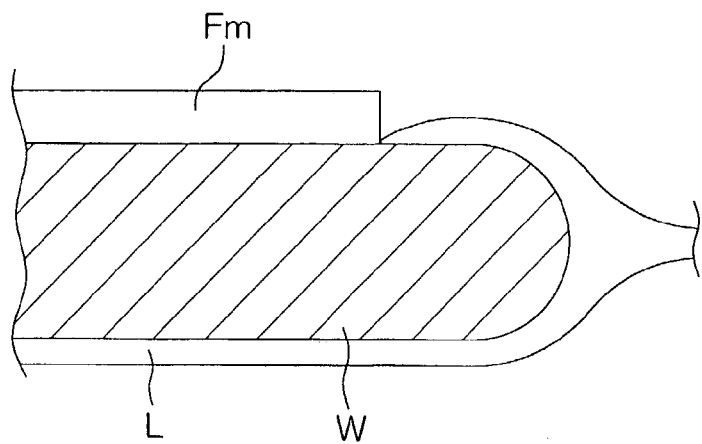
FIG. 3(c) is a schematic cross-sectional view for explaining the wafer processing method according to the second embodiment using the substrate processing apparatus shown in FIGS. 1(a) and 1(b)

FIGS. 3(a) to 3(c) are schematic cross-sectional views for explaining a wafer processing method according to a second embodiment using the substrate processing apparatus shown in FIGS. 1(a) and 1(b). In the wafer processing method, it is possible to remove particles adhering to a surface of a thin film formed on one surface of a wafer and subject the thin film to bevel etching.

A metal thin film Fm composed of copper (Cu) or the like is formed on one surface and an end surface (peripheral surface) of a wafer W. Particles P produced at the time of forming the metal thin film Fm adhere to a surface of the metal thin film Fm. The chemical supply source contains an etchant composed of a solution containing one or more components selected form hydrochloric acid, hydrofluoric acid, nitric acid, and hydrogen peroxide, and both the cleaning liquid supply sources respectively connected to the cleaning liquid pipes 12 and 22 contain a mixed solution of aqueous ammonia, hydrofluoric acid, and water (hereinafter referred to as a "particle removing liquid").

First, all the valves 11A to 13A, 22A, 23A, and 28A are brought into a closed state under control of the control section 20, and the up-and-down mechanism 25 is controlled by the control section 20 so that the shielding plate 2 is moved to the distant position. The wafer W is delivered to the spin chuck 1 by a robot hand (not shown), and is held almost horizontally on the spin chuck 1 with its surface on which the metal film Fm is formed directed upward. The up-and-down mechanism 5 is controlled by the control section 20 so that the wafer W held in the spin chuck 1 is rotated around its central axis C.

In this state, the valves 12A and 22A are opened under control of the control section 20, so that a particle removing liquid D0 is discharged toward the vicinities of the centers of the lower surface and the upper surface of the wafer W, respectively, from the lower nozzle 8 and the upper nozzle 18, thereby carrying out a pre-cleaning step. The particle removing liquid D0 expands along the upper surface and the lower surface of the wafer W by a centrifugal force caused by the rotation of the wafer W, to be spun off sideward at the peripheral edge of the wafer W (see FIG. 3(a)). In this case, the particles P adhering to the surface of the metal thin film Fm are removed. After the particle removing liquid D0 is discharged for a predetermined time period, the valves 12A and 22A are closed under control of the control section 20 so that the supply of the particle removing liquid D0 is stopped, thereby terminating the pre-cleaning step.

Subsequently, the rotation driving mechanism 15 is controlled by the control section 20, so that the shielding plate 2 is rotated. The up-and-down mechanism 25 is controlled by the control section 20, so that the shielding plate 2 is moved to the proximal position. The valve 28A is opened under control of the control section 20, so that nitrogen gas is discharged from the nitrogen gas discharge port 27. Accordingly, oxygen partial pressure in a space between the spin chuck 1 and the shielding plate 2 is reduced.

In this state, the valve 11A is opened under control of the control section 20, so that an etchant L is discharged toward the vicinity of the center of the lower surface of the wafer W from the lower nozzle 8. The etchant L expands along the lower surface of the wafer W by a centrifugal force caused by the rotation of the wafer W, to be spun off sideward at the peripheral edge of the wafer W. The respective surfaces of the wafer W and the metal thin film Fm have a wettability with the etchant L. Accordingly, a part of the etchant L flows around to the upper surface of the wafer W at the peripheral edge thereof (see FIG. 3(b)). Consequently, the metal thin film Fm on the end surface (peripheral surface) of the wafer W and at the peripheral edge of the upper surface thereof is etched away (see FIG. 3(c)). Therefore, the metal thin film Fm from which the particles P are removed can be left in a device formation region of the wafer W.

The valves 11A and 28A are then closed under control of the control section 20, so that the supply of the etchant L and the nitrogen gas is stopped. By the control section 20, the up-and-down mechanism 25 is controlled so that the shielding plate 2 is moved to the distant position, and the rotation driving mechanism 15 is controlled so that the rotation of the shielding plate 2 is stopped.

Subsequently, the valves 13A and 23A are opened under control of the control section 20, so that deionized water is discharged toward the lower surface and the upper surface of the wafer W, respectively, from the lower nozzle 8 and the upper nozzle 18. Consequently, the etchant L on the wafer W is removed. After the deionized water is supplied for a predetermined time period, the valves 13A and 23A are closed under control of the control section 20.

Thereafter, the rotation driving mechanism 5 is controlled by the control section 20, so that the wafer W held in the spin chuck 1 is rotated at high speed, to be spun off and dried. The processing of one wafer W is thus terminated.

In the foregoing method of processing the wafer W, the removal of the particles P adhering to the metal thin film Fm, the etching of the metal thin film Fm, and the subsequent cleaning of the wafer W using the deionized water can be simply carried out continuously by one apparatus.

The second embodiment can be deformed, as follows. That is, the substrate processing apparatus 10 shown in FIGS. 1(a) and 1(b) may be so configured that an etchant having a low concentration is selected as a preliminary cleaning liquid to be dischrgeable from the lower nozzle 8 and the upper nozzle 18. In this case, when the retreat region B appears after the metal thin film Fm is removed so that the etching residue R is produced, preliminary cleaning can be performed by supplying the preliminary cleaning liquid to the upper surface and the lower surface of the wafer W after etching using the etchant L and before cleaning using the deionized water. Consequently, the etching residue R is easily removed.

After the metal thin film Fm is first etched, the particles P on the metal thin film Fm may be removed using a mixed solution of aqueous ammonia, hydrogen peroxide, and water (a particle removing liquid).

Furthermore, the metal thin film Fm may be composed of tantalum (Ta) or titanium (Ti) in addition to copper. A thin film of a nitride such as tantalum nitride (TaN) or titanium nitride (TiN) or a thin film of an oxide such as tantalum oxide ($Ta_2O_5$) may be formed on the surface of the wafer W in place of the metal thin film Fm.

In this case, the particle removing liquid D0 may be a mixed solution of hydrofluoric acid, hydrogen peroxide, and water, or a hydrofluoric acid solution in addition to a mixed solution of aqueous ammonia, hydrogen peroxide, and water. In this case, the etchant L may be a mixed solution of hydrofluoric acid, nitric acid, and water, a hydrofluoric acid solution, a mixed solution of hydrofluoric acid, ozone water, and water, or a mixed solution of hydrochloric acid, hydrogen peroxide, and water. As the respective types of the particle removing liquid D0 and the etchant L, suitable ones of the foregoing types can be respectively selected depending on the types of the thin film formed on the surface of the wafer W.

Figure 4A:
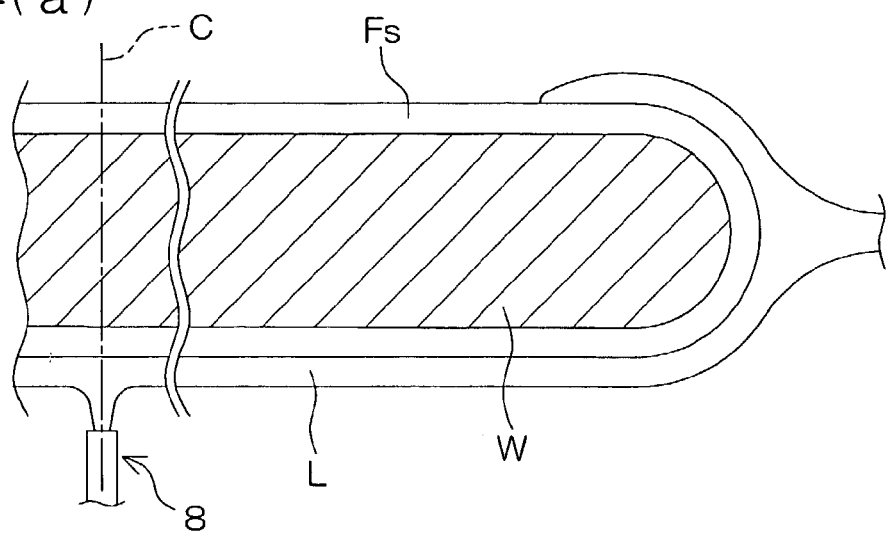
FIG. 4(a) is a schematic cross-sectional view for explaining a wafer processing method according to a third embodiment using the substrate processing apparatus shown in FIGS. 1(a) and 1(b)
Figure 4B:
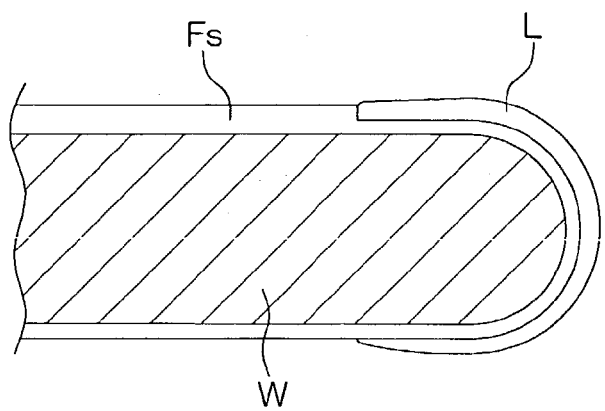
FIG. 4(b) is a schematic cross-sectional view for explaining the wafer processing method according to the third embodiment using the substrate processing apparatus shown in FIGS. 1(a) and 1(b)
Figure 4C:
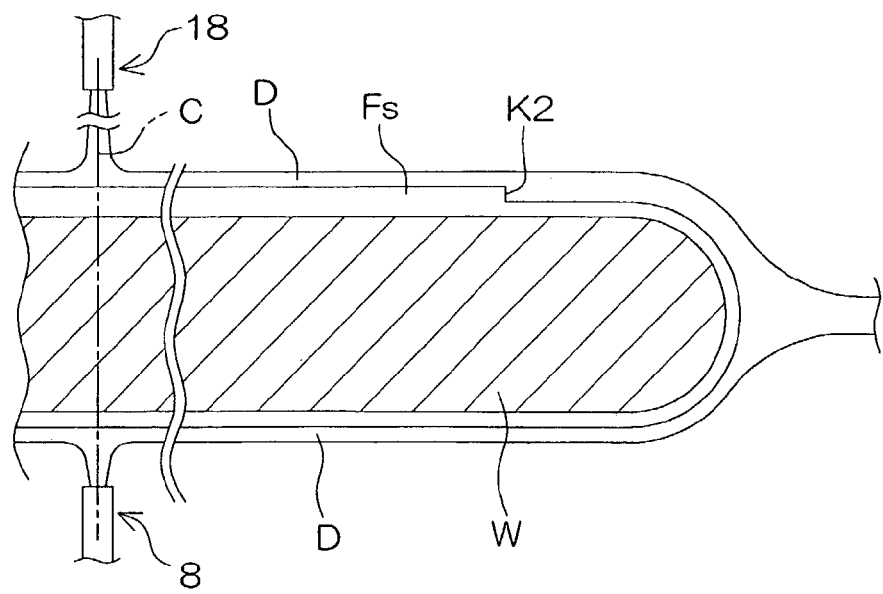
FIG. 4(c) is a schematic cross-sectional view for explaining the wafer processing method according to the third embodiment using the substrate processing apparatus shown in FIGS. 1(a) and 1(b)

FIGS. 4(a) to 4(c) are schematic cross-sectional views for explaining a wafer processing method according to a third embodiment using the substrate processing apparatus 10 shown in FIGS. 1(a) and 1(b). In the wafer processing method, a thin film formed with an approximately uniform thickness on both surfaces of a wafer can be subjected to bevel etching so that the thin film has a thickness distribution.

A thin film Fs composed of silicon oxide ($SiO_2$) or silicon nitride (SiN) is formed with an approximately uniform thickness on both surfaces and an end surface (peripheral surface) of a wafer W. The chemical supply source contains a fluoric acid solution having a high concentration as an etchant.

First, all the valves 11A to 13A, 22A, 23A, and 28A are brought into a closed state under control of the control section 20, and the up-and-down mechanism 25 is controlled by the control section 20 so that the shielding plate 2 is moved to the distant position. The wafer W is delivered to the spin chuck 1 by a robot hand (not shown), and is held almost horizontally on the spin chuck 1. The up-and-down mechanism 25 is then controlled by the control section 20 so that the shielding plate 2 is moved to the proximal position, and the rotation driving mechanisms 5 and 15 are controlled so that the wafer W held in the spin chuck 1 and the shielding plate 2 are rotated around a central axis C of the wafer W.

Subsequently, the valve 28A is opened under control of the control section 20, so that nitrogen gas is discharged from the nitrogen gas discharge port 27. Accordingly, oxygen partial pressure in a space between the spin chuck 1 and the shielding plate 2 is reduced.

In this state, the valve 11A is opened under control of the control section 20, so that an etchant L is discharged toward the vicinity of the center of the lower surface of the wafer W from the lower nozzle 8. The etchant L expands along the lower surface of the wafer W by a centrifugal force caused by the rotation of the wafer W, to be spun off sideward at the peripheral edge of the wafer W. The surface of the thin film Fs has a wettability with the etchant L. Accordingly, a part of the etchant L flows around to the upper surface of the wafer W at the peripheral edge thereof (see FIG. 4(a)). Consequently, the thin film Fs on the lower surface and the end surface (peripheral surface) of the wafer W and at the peripheral edge of the upper surface thereof is etched to be thinned.

When the thin film Fs on the lower surface of the wafer W and at the peripheral edge thereof is thinned to a suitable thickness, the valve 11A is closed under control of the control section 20. Consequently, the supply of the etchant L to the wafer W is stopped. Since the thin film Fs has a wettability with the etchant L, the etchant L remains at the peripheral edge of the wafer W (see FIG. 4). Further, the valve 28A is closed under control of the control section 20, so that the supply of nitrogen gas is stopped.

Subsequently, by the control section 20, the up-and-down mechanism 25 is controlled so that the shielding plate 2 is moved to the distant position, and the rotation driving mechanism 15 is controlled so that the rotation of the shielding plate 2 is stopped. The valves 13A and 23A are opened under control of the control section 20, so that deionized water D is discharged toward the lower surface and the upper surface of the wafer W, respectively, from the lower nozzle 8 and the upper nozzle 18 (see FIG. 4(c)). Consequently, the etchant L remaining at the peripheral edge of the wafer W is instantaneously removed. After the deionized water D is discharged for a predetermined time period, the valves 13A and 23A are closed under control of the control section 20.

Thereafter, the rotation driving mechanism 5 is controlled by the control section 20, so that the wafer W held in the spin chuck 1 is rotated at high speed, to be spun off and dried. The processing of one wafer W is thus terminated.

In the foregoing method of processing the wafer W, after the supply of the etchant L is stopped, the etchant L remaining at the peripheral edge of the wafer W is instantaneously removed by the deionized water D supplied to lower surface and the upper surface of the wafer W. Consequently, a fluoric acid solution having a high concentration is not brought into contact with an end K2 of a portion, which is not thinned, of the thin film Fs for a long time. Accordingly, the cross-sectional shape at the end of the portion, which is not thinned, of the thin film Fs can be prevented from being rounded.

Figure 5A:
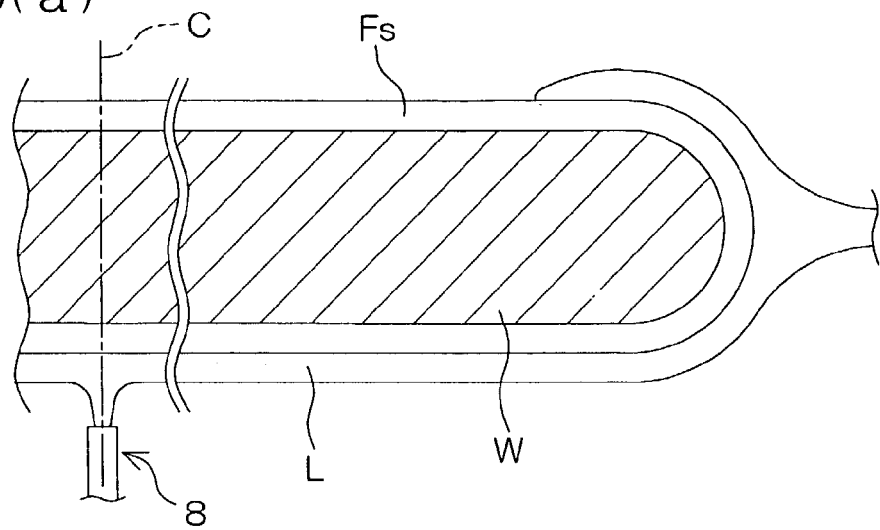
FIG. 5(a) is a schematic cross-sectional view for explaining a wafer processing method according to a fourth embodiment using the substrate processing apparatus shown in FIGS. 1(a) and 1(b)
Figure 5B:
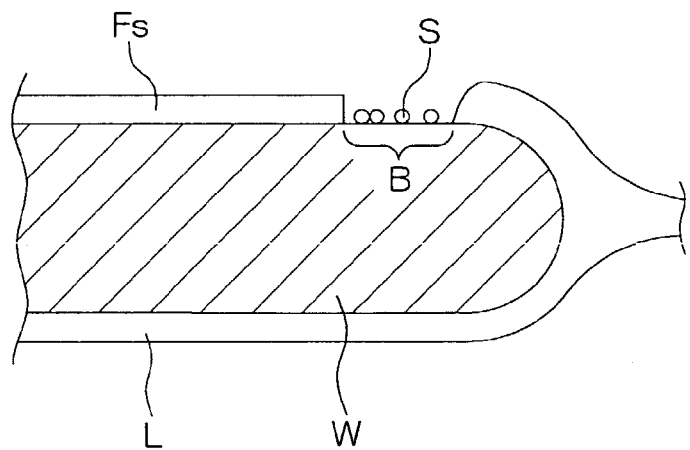
FIG. 5(b) is a schematic cross-sectional view for explaining the wafer processing method according to the fourth embodiment using the substrate processing apparatus shown in FIGS. 1(a) and 1(b)
Figure 5C:
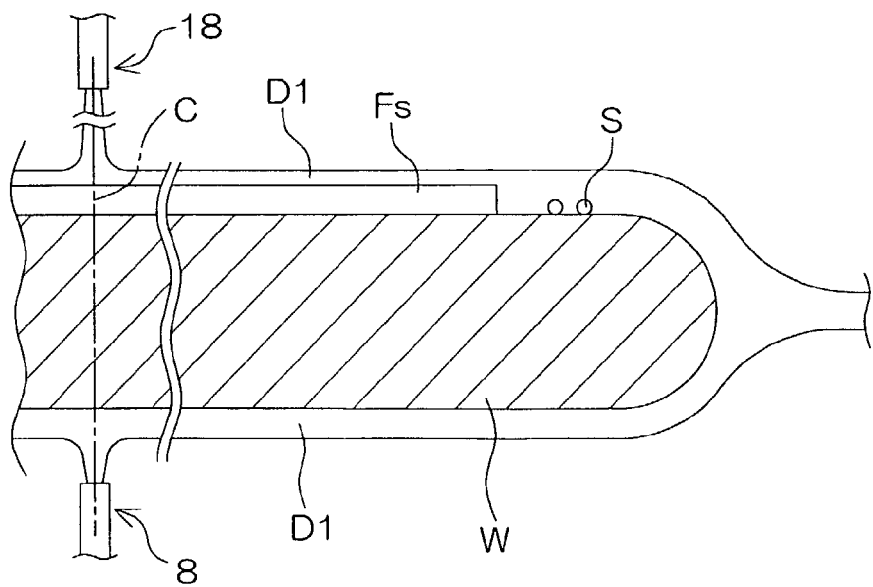
FIG. 5(c) is a schematic cross-sectional view for explaining the wafer processing method according to the fourth embodiment using the substrate processing apparatus shown in FIGS. 1(a) and 1(b)

FIGS. 5(a) to 5(c) are schematic cross-sectional views for explaining a wafer processing method according to a fourth embodiment using the substrate processing apparatus 10 shown in FIGS. 1(a) and 1(b). In the wafer processing method, it is possible to remove, in a wafer having a thin film formed on both its surfaces, the thin film on the one surface of the wafer and at a peripheral edge of the other surface thereof by bevel etching.

A thin film Fs composed of silicon oxide ($SiO_2$) or silicon nitride (SiN) is formed on both surfaces and an end surface (peripheral surface) of a wafer W. The chemical supply source contains a buffered hydrofluoric acid solution (a mixed solution of fluoric acid, ammonium fluoride, and water) as an etchant, and both the cleaning liquid supply sources respectively connected to the cleaning liquid pipes 12 and 22 contain a fluoric acid solution having a low concentration as a preliminary cleaning liquid.

First, all the valves 11A to 13A, 22A, 23A, and 28A are brought into a closed state under control of the control section 20, and the up-and-down mechanism 25 is controlled by the control section 20 so that the shielding plate 2 is moved to the distant position. The wafer W is delivered to the spin chuck 1 by a robot hand (not shown), and is held almost horizontally on the spin chuck 1. By the control section 20, the up-and-down mechanism 25 is controlled so that the shielding plate 2 is moved to the proximal position, and the rotation driving mechanisms 5 and 15 are controlled so that the wafer W held in the spin chuck 1 and the shielding plate 2 are rotated around a central axis C of the wafer W.

Subsequently, the valve 28A is opened under control of the control section 20, so that nitrogen gas is discharged from the nitrogen gas discharge port 27. Accordingly, oxygen partial pressure in a space between the spin chuck 1 and the shielding plate 2 is reduced.

In this state, the valve 11A is opened under control of the control section 20, so that an etchant L is discharged toward the vicinity of the center of the lower surface of the wafer W from the lower nozzle 8. The etchant L expands along the lower surface of the wafer W by a centrifugal force caused by the rotation of the wafer W, to be spun off sideward at the peripheral edge of the wafer W. The surface of the thin film Fs has a wettability with the etchant L. Accordingly, a part of the etchant L flows around to the upper surface of the wafer W (see FIG. 5(a)). Consequently, the thin film Fs on the lower surface and the end surface (peripheral surface) of the wafer W and at the peripheral edge of the upper surface thereof is etched away.

The wettability of a portion, which is exposed because the thin film Fs is removed, of the wafer W with the etchant L is lower than the wettability of the thin film Fs with the etchant L. When the thin film Fs at the peripheral edge of the upper surface of the wafer W is removed, therefore, a width along which the etchant L flows around to the upper surface of the wafer W is reduced, so that a retreat region B appears. When water evaporates, a constituent component of a buffered hydrofluoric acid solution is crystallized. Therefore, a crystallized product S is produced in the retreat region B (see FIG. 5(b)).

The valves 11A and 28A are then closed under control of the control section 20, so that the supply of the etchant L and the nitrogen gas is stopped. By the control section 20, the up-and-down mechanism 25 is controlled so that the shielding plate 2 is moved to the distant position, and the rotation driving mechanism 15 is controlled so that the rotation of the shielding plate 2 is stopped.

Subsequently, the valves 12A and 22A are opened under control of the control section 20, so that a preliminary cleaning liquid D1 is discharged toward the lower surface and the upper surface of the wafer W, respectively, from the lower nozzle 8 and the upper nozzle 18. The preliminary cleaning liquid D1 expands along the lower surface and the upper surface of the wafer W, to be spun off sideward at the peripheral edge of the wafer W. In this case, the crystallized product S produced in the retreat region B is easily removed by the preliminary cleaning liquid D1 (see FIG. 5(c)).

Then, under control of the control section 20, the valves 12A and 22A are closed, and the valves 13A and 23A are opened, so that deionized water is discharged toward the lower surface and the upper surface of the wafer W, respectively, from the lower nozzle 8 and the upper nozzle 18, thereby cleaning the wafer W. Consequently, the preliminary cleaning liquid D1 on the wafer W is removed. After the deionized water is discharged for a predetermined time period, the valves 13A and 23A are closed under control of the control section 20.

Thereafter, the rotation driving mechanism 5 is controlled by the control section 20, so that the wafer W held in the spin chuck 1 is rotated at high speed, to be spun off and dried. The processing of one wafer W is thus terminated.

In the foregoing method of processing the wafer W, the crystallized product S produced as the etching processing is performed is simply removed by the preliminary cleaning liquid D1. Therefore, the wafer W can be cleaned in a short time period after the etching processing.

The fourth embodiment can be deformed, as follows. That is, an etchant L (a chemical) is not limited to the buffered hydrofluoric acid solution. When the etchant L is one which produces a crystallized product S by the evaporation of a solvent, the crystallized product S can be easily removed by the same method. In this case, selected as the preliminary cleaning liquid D1 is one more suitable for the type of the etchant L.

Figure 6:
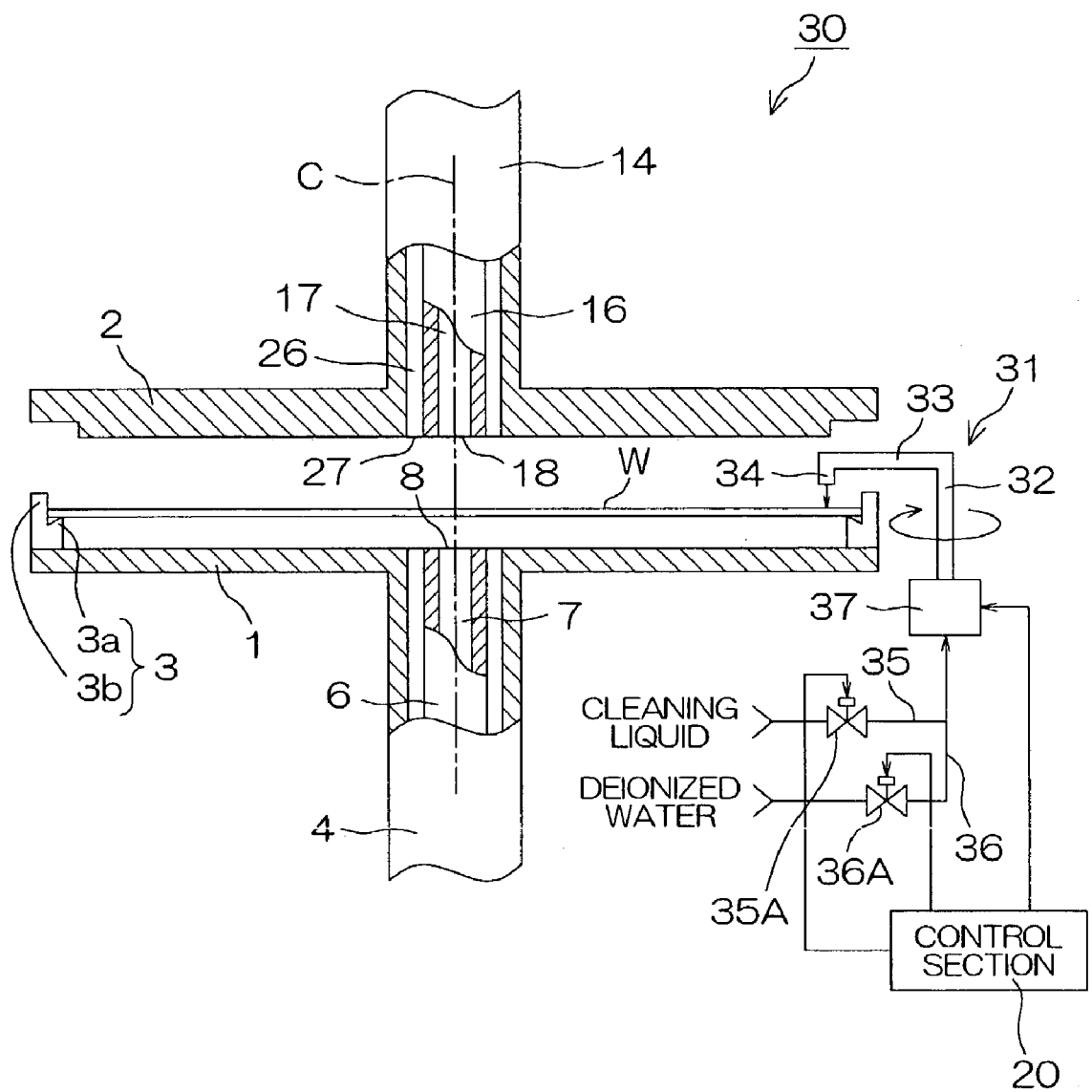
FIG. 6 is a schematic cross-sectional view showing the configuration of a substrate processing apparatus according to a second embodiment of the present invention.

FIG. 6 is a schematic cross-sectional view showing the configuration of a substrate processing apparatus 30 according to a second embodiment of the present invention. In FIG. 6, constituent elements corresponding to the constituent elements of the substrate processing apparatus 10 shown in FIGS. 1(a) and 1(b) are assigned the same reference alphanumeric characters and hence, the description thereof is not repeated.

The substrate processing apparatus 30 comprises an auxiliary processing mechanism 31 for supplying a processing liquid to a peripheral edge of an upper surface of a wafer W held in a spin chuck 1 in addition to the constituent elements of the substrate processing apparatus 10 shown in FIGS. 1(a) and 1(b). The auxiliary processing mechanism 31 comprises a processing liquid pipe 32 disposed along a vertical direction beside the spin chuck 1, an extending pipe 33 extending along an approximately horizontal direction from an upper end of the processing liquid pipe 32, and an auxiliary nozzle 34 connected to a front end of the extending pipe 33. The extending pipe 33 is disposed at a position higher than the wafer W held in the spin chuck 1. The auxiliary nozzle 34 is directed downward and is opened at a height position corresponding to a position just above the wafer W held in the spin chuck 1.

A lower end of the processing liquid pipe 32 is branched into a cleaning liquid pipe 35 and a deionized water pipe 36. The cleaning liquid pipe 35 is connected to a cleaning liquid supply source containing a cleaning liquid, and the deionized water pipe 36 is connected to a deionized water supply source containing deionized water. A valve 35A is interposed in the cleaning liquid pipe 35, and a valve 36A is interposed in the deionized water pipe 36. The cleaning liquid and the deionized water can be switched and discharged from the auxiliary nozzle 34 by respectively opening or closing the valves 35A and 36A. The opening or closing of the valves 35A and 36A is controlled by a control section 20.

A rotating mechanism 37 is coupled to the cleaning liquid pipe 35, and the cleaning liquid pipe 32 can be rotated around its axis. Consequently, the auxiliary nozzle 34 can be moved between an opposed position where it is opposed to a peripheral edge of an upper surface of the wafer W held in the spin chuck 1 and a stand-by position where it retreats from an upper part of the wafer W.

By the above-mentioned configuration, the cleaning liquid and the deionized water can be switched and discharged to the peripheral edge of the wafer W held in the spin chuck 1 using the auxiliary processing mechanism 31.

The cleaning liquid supply source connected to the cleaning liquid pipe 35 may be the same as or different from the cleaning liquid supply source connected to the cleaning liquid pipe 12 or the cleaning liquid supply source connected to the cleaning liquid pipe 22. Similarly, the deionized water supply source connected to the deionized water pipe 36 may be the same as or different from the deionized water supply source connected to the deionized water pipe 13 or the deionized water supply source connected to the deionized water pipe 23.

Figure 7A:
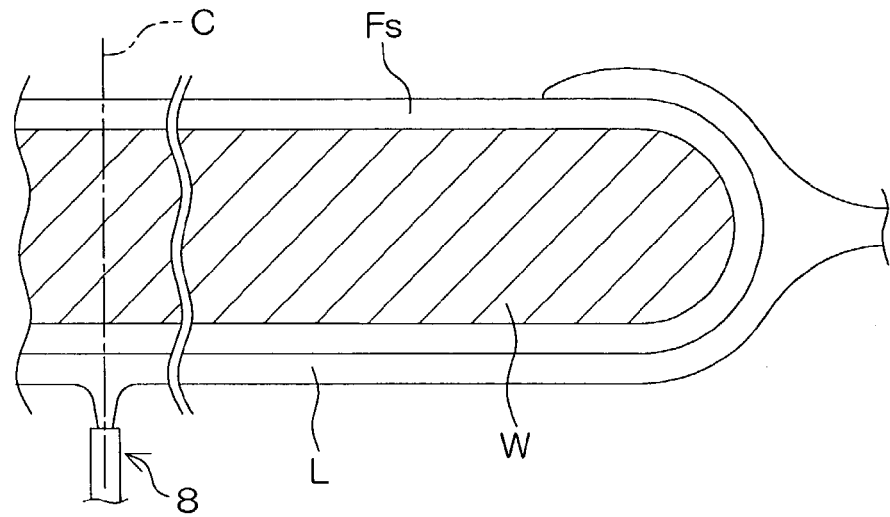
FIG. 7(a) is a schematic cross-sectional view for explaining an embodiment of a wafer processing method using the substrate processing apparatus shown in FIG. 6.
Figure 7B:
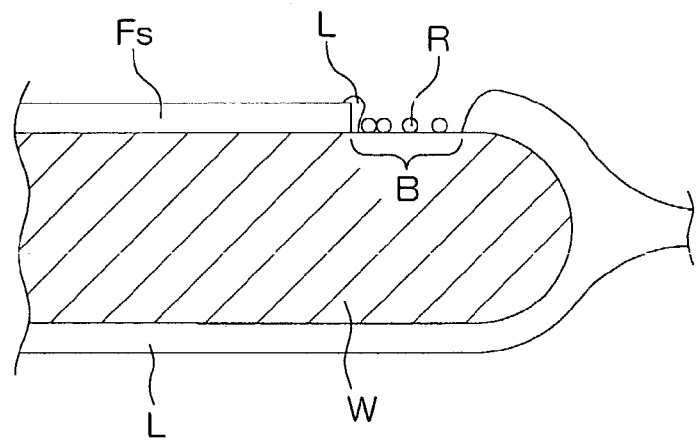
FIG. 7(b) is a schematic cross-sectional view for explaining the embodiment of the wafer processing method using the substrate processing apparatus shown in FIG. 6.
Figure 7C:
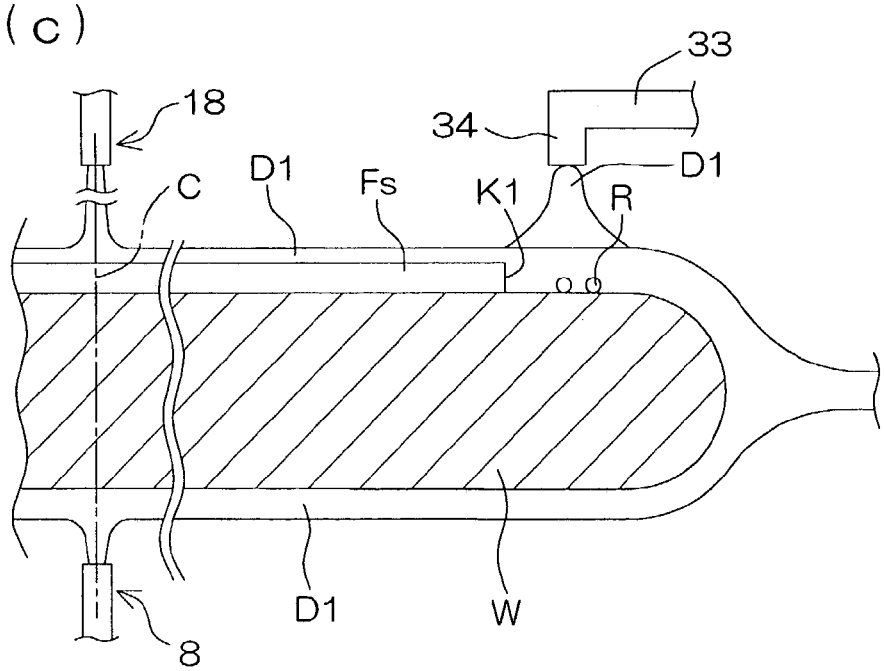
FIG. 7(c) is a schematic cross-sectional view for explaining the embodiment of the wafer processing method using the substrate processing apparatus shown in FIG. 6.

FIGS. 7(a) to 7(c) are schematic cross-sectional views for explaining an embodiment of a wafer processing method using the substrate processing apparatus 30 shown in FIG. 6. In FIGS. 7(a) to 7(c), constituent elements and the like corresponding to the constituent elements shown in FIGS. 2(a) to 2(c) and FIG. 6 are assigned the same reference alphanumeric characters and hence, the description thereof is not repeated. In the wafer processing method, it is possible to remove, in a wafer having a thin film formed on both its surfaces, the thin film on the one surface of the wafer and at a peripheral edge of the other surface thereof by bevel etching.

A thin film Fs composed of silicon oxide or silicon nitride is formed on both surfaces and an end surface (peripheral surface) of a wafer W. The chemical supply source contains a hydrofluoric acid solution having a high concentration as an etchant, and the cleaning liquid supply sources respectively connected to the cleaning liquid pipes 12, 22 and 35 contain a hydrofluoric acid solution having a low concentration as a preliminary cleaning liquid.

First, all the valves 11A to 13A, 22A, 23A, 28A, 35A and 36A are brought into a closed state under control of the control section 20. By the control section 20, the up-and-down mechanism 25 is controlled so that the shielding plate 2 is moved to the distant position, and the rotating mechanism 37 is controlled so that the auxiliary nozzle 34 is moved to the stand-by position. In this state, the wafer W is delivered to the spin chuck 1 by a robot hand (not shown), and is held almost horizontally on the spin chuck 1.

By the control section 20, the up-and-down mechanism 25 is then controlled so that the shielding plate 2 is moved to the proximal position, and the rotation driving mechanisms 5 and 15 are controlled so that the wafer W held in the spin chuck 1 and the shielding plate 2 are rotated around a central axis C of the wafer W. Subsequently, the valve 28A is opened under control of the control section 20, so that nitrogen gas is discharged from the nitrogen gas discharge port 27. Accordingly, oxygen partial pressure in a space between the spin chuck 1 and the shielding plate 2 is reduced.

In this state, the valve 11A is opened under control of the control section 20, so that an etchant L is discharged toward the vicinity of the center of the lower surface of the wafer W from the lower nozzle 8 (see FIG. 7(a)). Consequently, the thin film Fs on the lower surface and the end surface (peripheral surface) of the wafer W and at the peripheral edge of the upper surface thereof is etched away. Correspondingly, a retreat region B appears, so that an etching residue R is produced in the retreat region B (see FIG. 7(b)).

The valve 11A is then closed under control of the control section 20, so that the supply of the etchant L is stopped. In this state, the etchant L remains at the peripheral edge of the wafer W and in the vicinity of an end of the thin film Fs. Thereafter, the rotation driving mechanism 15 is controlled by the control section 20 so that the rotation of the shielding plate 2 is stopped.

The up-and-down mechanism 25 is then controlled by the control section 20, so that the shielding plate 2 is slightly raised from the proximal position, and is brought into a state where the auxiliary nozzle 34 and the extending pipe 33 are insertable between the wafer W held in the spin chuck 1 and the shielding plate 2. Thereafter, the rotation driving mechanism 15 is controlled by the control section 20, so that the shielding plate 2 is rotated again.

Subsequently, the rotating mechanism 37 is controlled by the control section 20, so that the auxiliary nozzle 34 is moved to the opposite position. Consequently, the auxiliary nozzle 34 is opposed to the vicinity of the retreat region B. Further, the valves 12A, 22A, and 35A are opened under control of the control section 20, so that a preliminary cleaning liquid D1 is discharged toward the center of the lower surface of the wafer W, the center of the upper surface of the wafer W, and the peripheral edge of the upper surface of the wafer W, respectively, from the lower nozzle 8, the upper nozzle 18, and the auxiliary nozzle 34. The discharge of the nitrogen gas from the nitrogen gas discharge port 27 is continued.

The preliminary cleaning liquid D1 discharged from the lower nozzle 8 and the upper nozzle 18 expands along the lower surface and the upper surface of the wafer W, to be spun off sideward at the peripheral edge of the wafer W. The preliminary cleaning liquid D1 is directly supplied to the vicinity of the retreat region B from the auxiliary nozzle 34 (see FIG. 7(c)). Consequently, the etchant L and the etching residue R which remain at the peripheral edge of the wafer W and in the vicinity of the end of the thin film Fs are instantaneously removed.

After the preliminary cleaning liquid D1 is discharged for a predetermined time period, the valves 12A, 22A, and 35A are closed under control of the control section 20, so that the discharge of the preliminary cleaning liquid D1 from the lower nozzle 8, the upper nozzle 18, and the auxiliary nozzle 34 is terminated. The valves 13A, 23A, and 36A are opened under control of the control section 20, so that deionized water is discharged toward the center of the lower surface of the wafer W, the center of the upper surface of the wafer W, and the peripheral edge of the upper surface of the wafer W, respectively, from the lower nozzle 8, the upper nozzle 18, and the auxiliary nozzle 34. The discharge of the nitrogen gas from the nitrogen gas discharge port 27 is continued.

The deionized water discharged from the lower nozzle 8 and the upper nozzle 18 expands along the lower surface and the upper surface of the wafer W, to be spun off sideward at the peripheral edge of the wafer W. The deionized water is directly supplied to the vicinity of the retreat region B from the auxiliary nozzle 34. Consequently, the preliminary cleaning liquid D1 on the wafer W is instantaneously removed, After the deionized water is discharged for a predetermined time period, the valves 13A, 23A, and 36A are closed under control of the control section 20. Subsequently, the rotation driving mechanism 5 is controlled by the control section 20, so that the wafer W held in the spin chuck 1 is rotated at high speed, to be spun off and dried. Thereafter, the valve 28A is closed under control of the control section 20, so that the discharge of the nitrogen gas from the nitrogen gas discharge port 27 is terminated. The processing of one wafer W is thus terminated.

In the foregoing method of processing the wafer W, the steps from the bevel etching processing to the processing for spinning off and drying the wafer W are all carried out under an atmosphere of low oxygen partial pressure, whereby the wafer W can hardly be oxidized. Further, the preliminary cleaning liquid D1 and the deionized water are directly supplied to the vicinity of the retreat region B from the auxiliary nozzle 34, whereby the etching residue R, the etchant, and the preliminary cleaning liquid which exist in the vicinity of the retreat region B are removed quickly and reliably.

Figure 8:
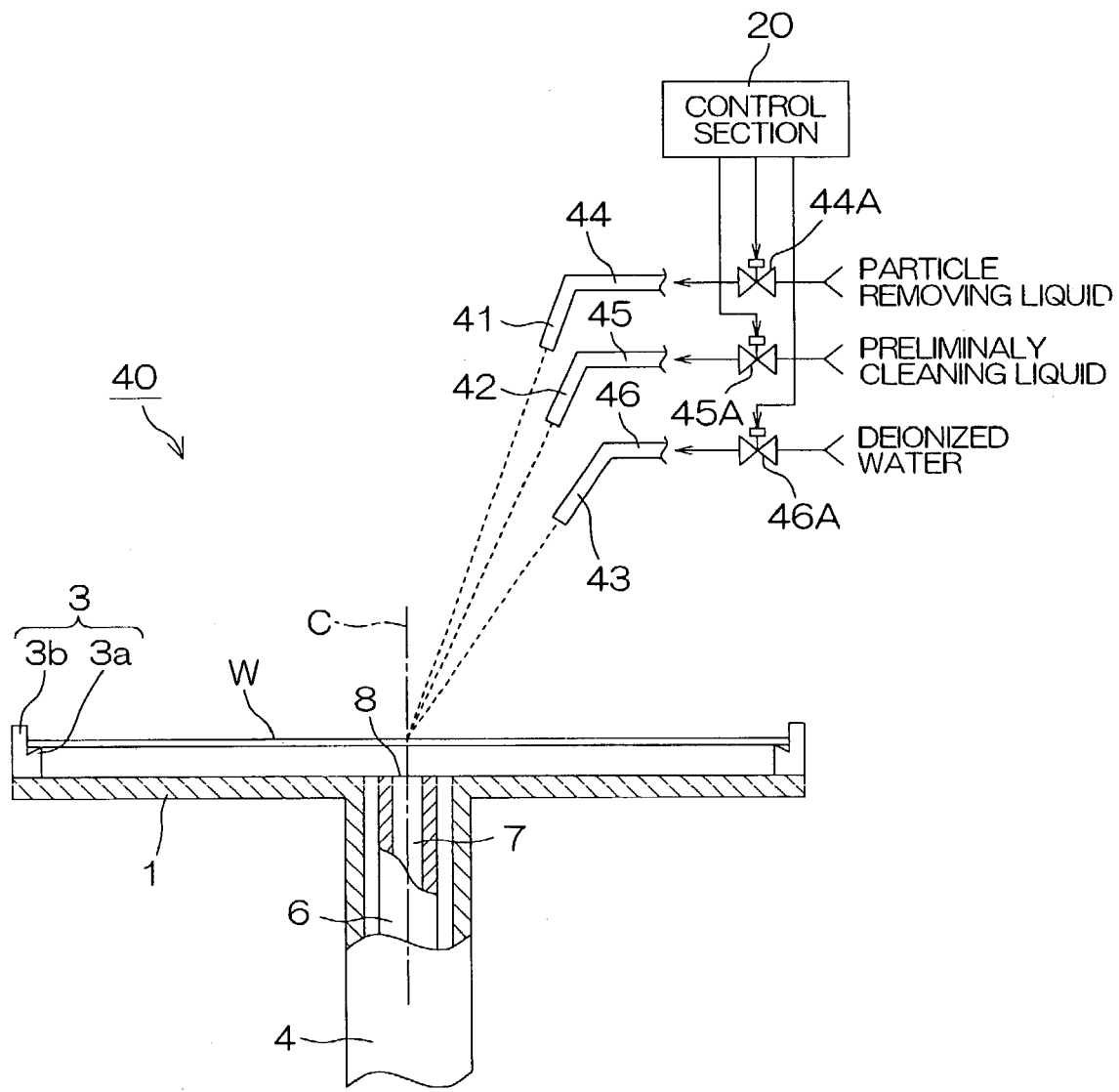
FIG. 8 is a schematic cross-sectional view showing the configuration of a substrate processing apparatus according to a third embodiment of the present invention.

FIG. 8 is a schematic cross-sectional view showing the configuration of a substrate processing apparatus 40 according to a third embodiment of the present invention. In FIG. 8, constituent elements corresponding to the constituent elements of the substrate processing apparatus 10 shown in FIGS. 1(a) and 1(b) are assigned the same reference alphanumeric characters and hence, the description thereof is not repeated.

Although the substrate processing apparatus 40 has the same configuration as that of the substrate processing apparatus shown in FIGS. 1(a) and 1(b), the shielding plate 2 is not provided. Further, a particle removing liquid discharge nozzle 41, a preliminary cleaning liquid discharge nozzle 42, and a deionized water discharge nozzle 43 are provided at positions shifted from a central axis C of a wafer W held in a spin chuck 1 above the spin chuck 1. The particle removing liquid discharge nozzle 41, the preliminary cleaning liquid discharge nozzle 42, and the deionized water discharge nozzle 43 are respectively arranged at different height positions. The deionized water discharge nozzle 43 is at the lowest position, and the particle removing liquid discharge nozzle 41 is at the highest position. All the particle removing liquid discharge nozzle 41, the preliminary cleaning liquid discharge nozzle 42, and the deionized water discharge nozzle 43 are directed toward the center of the wafer W held in the spin chuck 1.

The particle removing liquid discharge nozzle 41 is connected to a particle removing liquid supply source through a particle removing liquid pipe 44. The preliminary cleaning liquid discharge nozzle 42 is connected to a preliminary cleaning liquid supply source through a preliminary cleaning liquid pipe 45. The deionized water discharge nozzle 43 is connected to a deionized water supply source through a deionized water pipe 46. A valve 44A is interposed in the particle removing liquid pipe 44, a valve 45A is interposed in the preliminary cleaning liquid pipe 45, and a valve 46A is interposed in the deionized water pipe 46.

A particle removing liquid, a preliminary cleaning liquid, and deionized water can be respectively discharged toward the vicinity of the center of an upper surface of the wafer W held in the spin chuck 1 from the particle removing liquid discharge nozzle 41, the preliminary cleaning liquid discharge nozzle 42, and the deionized water discharge nozzle 43 by opening or closing the valves 44A, 45A, and 46A.

Consequently, it is possible to remove particles by the particle removing liquid, remove an etching residue R and an etchant by the preliminary cleaning liquid, and remove the preliminary cleaning liquid or the particle removing liquid by the deionized water.

The substrate processing apparatus 40 does not have a flow path employed in common by two or more types of processing liquids out of the particle removing liquid, the preliminary cleaning liquid, and the deionized water which are supplied to the upper surface of the wafer W. Consequently, a liquid obtained by mixing two or more types of processing liquids out of the particle removing liquid, the preliminary cleaning liquid, and the deionized water can be prevented from being supplied to the upper surface of the wafer W.

Figure 9:
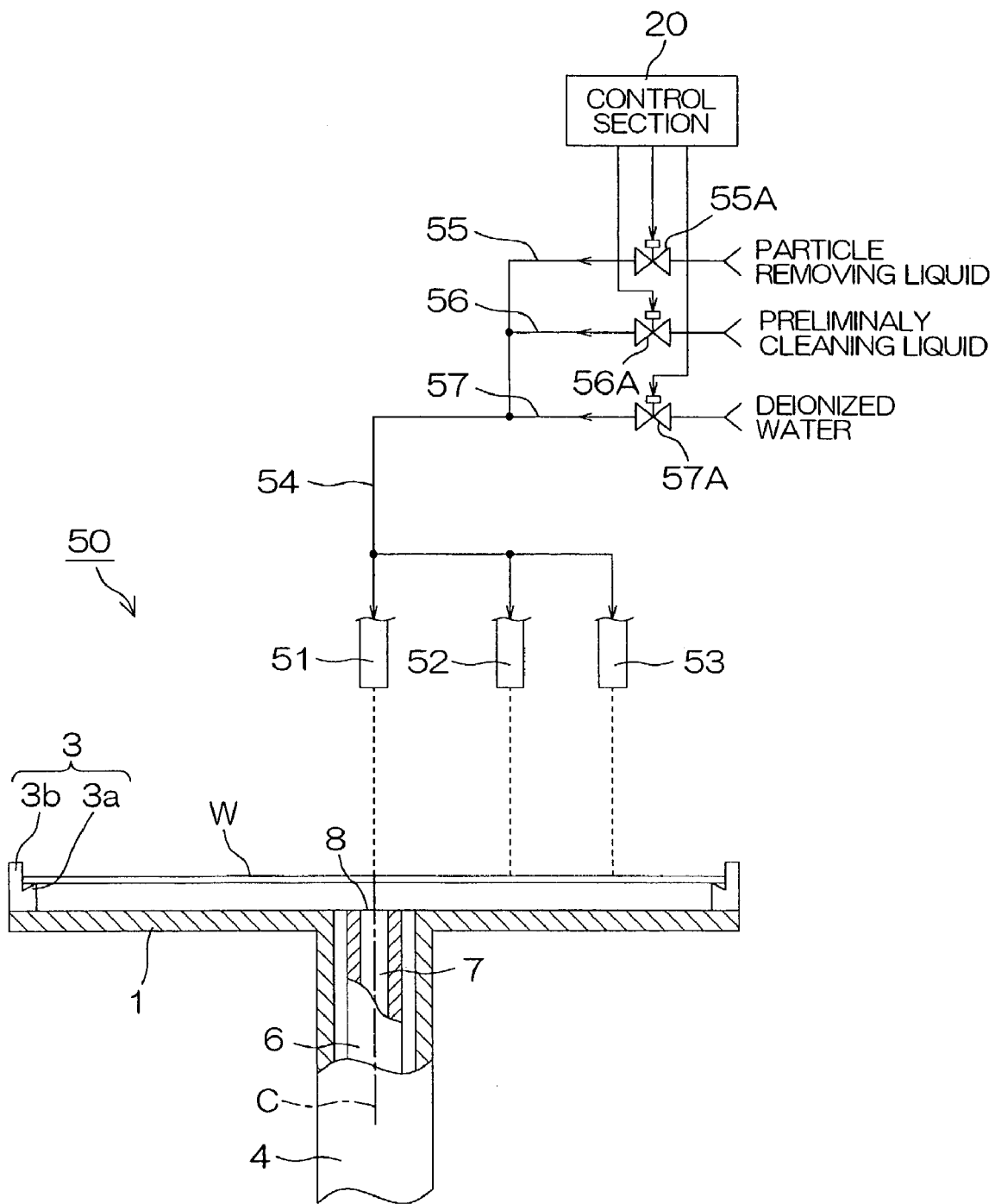
FIG. 9 is a schematic cross-sectional view showing the configuration of a substrate processing apparatus according to a fourth embodiment of the present invention.

FIG. 9 is a schematic cross-sectional view showing the configuration of a substrate processing apparatus 50 according to a fourth embodiment of the present invention. In FIG. 9, constituent elements corresponding to the constituent elements of the substrate processing apparatus 10 shown in FIGS. 1(a) and 1(b) are assigned the same reference alphanumeric characters and hence, the description thereof is not repeated.

Although the substrate processing apparatus 50 has the same configuration as that of the substrate processing apparatus shown in FIGS. 1(a) and 1(b), the shielding plate 2 is not provided, similarly to the substrate processing apparatus 40 shown in FIG. 8. Further, first to third upper nozzles 51 to 53 are provided above a spin chuck 1 in place of the upper nozzle 18. The first upper nozzle 51 is arranged nearly on a central axis C of a wafer W held in the spin chuck 1, and the third upper nozzle 53 is arranged above a peripheral edge of the wafer W. The second upper nozzle 52 is arranged between the first upper nozzle 51 and the third upper nozzle 53 with respect to the radial direction of the wafer W. All the first to third upper nozzles 51 to 53 are directed downward in a vertical direction.

All the first to third upper nozzles 51 to 53 are connected to one end of an upper processing liquid pipe 54. The other end of the upper processing liquid pipe 54 is branched into a particle removing liquid pipe 55, a preliminary cleaning liquid pipe 56, and a deionized water pipe 57. The particle removing liquid pipe 55, the preliminary cleaning liquid pipe 56, and the deionized water pipe 57 are respectively connected to a particle removing liquid supply source, a preliminary cleaning liquid supply source, and a deionized water supply source.

Valves 55A, 56A, and 57A are respectively interposed in the particle removing liquid pipe 55, the preliminary cleaning liquid pipe 56, and the deionized water pipe 57. A particle removing liquid, a preliminary cleaning liquid, and deionized water can be switched to be respectively discharged from the first to third upper nozzles 51 to 53 by opening or closing the valves 55A, 56A, and 57A, and can be supplied to an upper surface of the wafer W held in the spin chuck 1. The opening or closing of the valves 55A, 56A, and 57A is controlled by a control section 20.

The same type of processing liquid (any one of the particle removing liquid, the preliminary cleaning liquid, and the deionized water) is discharged from the first to third upper nozzles 51 to 53. The processing liquid discharged from the first upper nozzle 51 is supplied to the vicinity of the center of the wafer W, the processing liquid discharged from the second upper nozzle 52 is supplied to a portion between the center of the wafer W and a peripheral edge thereof with respect to the radial direction of the wafer W, and the processing liquid discharged from the third upper nozzle 53 is supplied to the peripheral edge of the wafer W.

When the processing liquid is supplied to only the center of the upper surface of the wafer W, as in the substrate processing apparatus 10 shown in FIGS. 1(a) and 1(b) and the substrate processing apparatus 40 shown in FIG. 8, the processing liquid expands to flow from the center of the wafer W to the peripheral edge thereof. Accordingly, the amount of the processing liquid supplied per unit area of the upper surface of the wafer W is large at the center of the wafer W, while being small at the peripheral edge of the wafer W. When the first to third upper nozzles 51 to 53 are arranged at different positions with respect to the radial direction of the wafer W, as in the substrate processing apparatus 50 shown in FIG. 9, a sufficiently large amount of processing liquid per unit area can be also supplied to a region departing from the center of the wafer W.

For example, the processing liquid discharged from the second upper nozzle 52 is supplied, in addition to the processing liquid discharged from the first upper nozzle 51 and flowing along the upper surface of the wafer W, to the portion between the center of the wafer W and the peripheral edge thereof with respect to the radial direction of the wafer W. The processing liquid discharged from the third upper nozzle 53 is supplied, in addition to the processing liquid discharged from the first and second upper nozzles 51 and 52 and flowing along the upper surface of the wafer W, to the peripheral edge of the wafer W. Further, the first upper nozzle 51 is arranged nearly on the central axis C of the wafer W held in the spin chuck 1. Therefore, a sufficient amount of processing liquid can be also supplied to the center of the upper surface of the wafer W.

Figure 10:
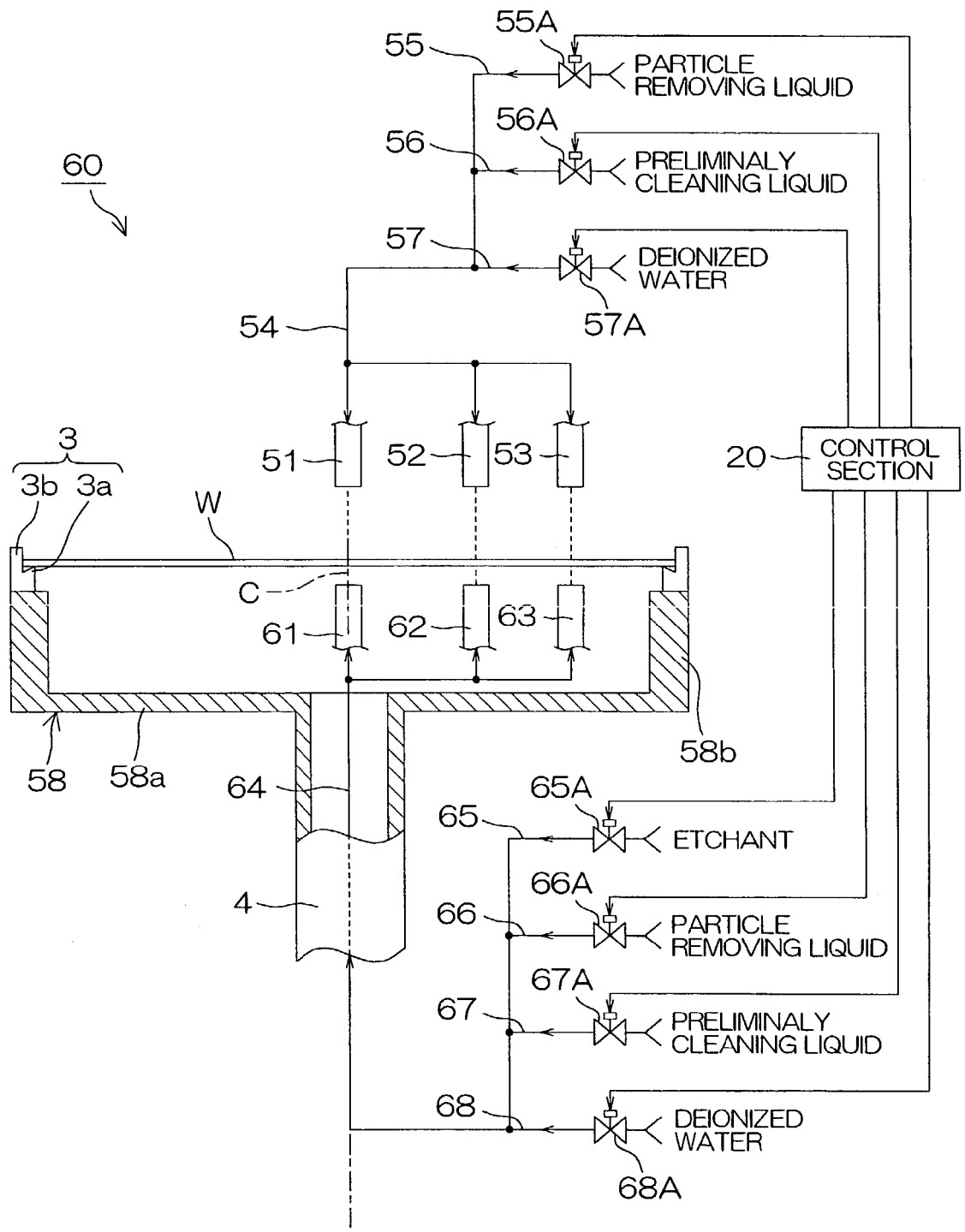
FIG. 10 is a schematic cross-sectional view showing the configuration of a substrate processing apparatus according to a fifth embodiment of the present invention.
Figure 11A:
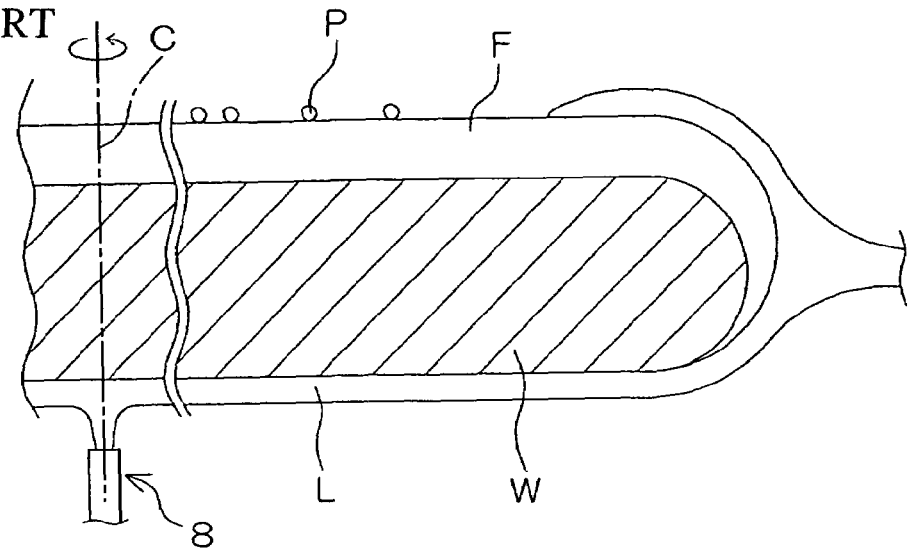
FIG. 11(a) is a schematic cross-sectional view for explaining a conventional method of bevel etching.
Figure 11B:
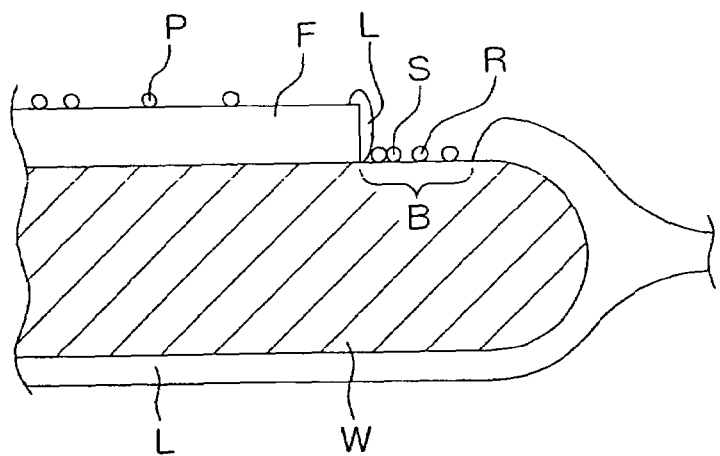
FIG. 11(b) is a schematic cross-sectional view for explaining the conventional method of bevel etching.
Figure 11C:
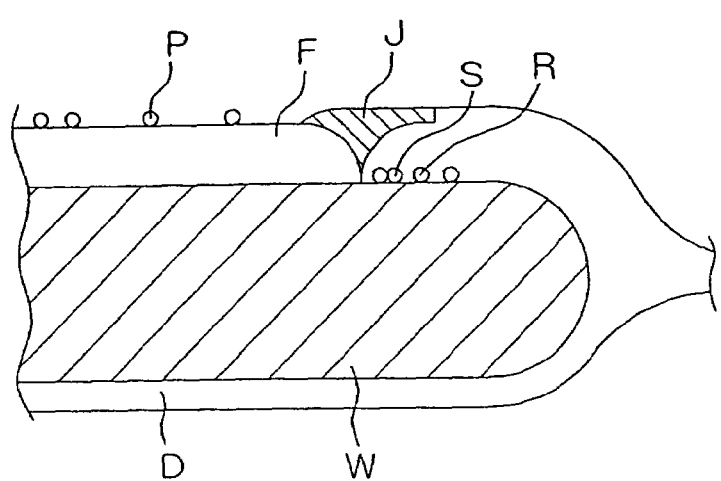
FIG. 11(c) is a schematic cross-sectional view for explaining the conventional method of bevel etching.

FIG. 10 is a schematic cross-sectional view showing the configuration of a substrate processing apparatus 60 according to a fifth embodiment of the present invention. In FIG. 10, constituent elements corresponding to the constituent elements of the substrate processing apparatuses 10 and 50 shown in FIGS. 1(a) and 1(b) and FIG. 9 are assigned the same reference alphanumeric characters and hence, the description thereof is not repeated.

The substrate processing apparatus 60 can respectively supply a processing liquid to an upper surface and a lower surface of a wafer W held in a spin chuck 1 by a plurality of nozzles. Although the substrate processing apparatus 60 has the same configuration as that of the substrate processing apparatus 50 shown in FIG. 9, a spin chuck 58 having a cylindrical portion 58*b* provided in a standing condition from an edge of a disk-shaped spin base 58*a* in place of the spin chuck 1. Chuck pins 3 are provided at an upper end of the cylindrical portion 58*b* so that the wafer W can be held at a position more distant from the spin base 58*a*, as compared with the substrate processing apparatus 50 shown in FIG. 9.

First to third lower nozzles 61 to 63 are accommodated inside the cylindrical portion 58*b*.

The first lower nozzle 61 is arranged nearly on a central axis C of the wafer W held in the spin chuck 1, and the third lower nozzle 63 is arranged below a peripheral edge of the wafer W. The second lower nozzle 62 is arranged between the first lower nozzle 61 and the third lower nozzle 63 with respect to the radial direction of the wafer W. All the first to third lower nozzles 61 to 63 are directed upward in a vertical direction.

A lower processing liquid pipe 64 is inserted through a rotating shaft 4, and an upper end of the lower processing liquid pipe 64 is branched to be connected to the first to third lower nozzles 61 to 63. A lower end of the lower processing liquid pipe 64 is branched into an etchant pipe 65, a particle removing liquid pipe 66, a preliminary cleaning liquid pipe 67, and a deionized water pipe 68. The etchant pipe 65, the particle removing liquid pipe 66, the preliminary cleaning liquid pipe 67, and the deionized water pipe 68 are respectively connected to an etchant supply source, a particle removing liquid supply source, a preliminary cleaning liquid supply source, and a deionized water supply source.

Valves 65A, 66A, 67A, and 68A are respectively interposed in the etching liquid pipe 65, the particle removing liquid pipe 66, the preliminary cleaning liquid pipe 67, and the deionized water pipe 68. An etchant, a particle removing liquid, a preliminary cleaning liquid, and deionized water can be switched to be respectively discharged from the first to third lower nozzles 61 to 63 by opening or closing the valves 65A to 68A, and can be supplied to a lower surface of the wafer W held in the spin chuck 1. The opening or closing of the valves 65A to 68A is controlled by a control section 20.

The same type of processing liquid (any one of the etchant, the particle removing liquid, the preliminary cleaning liquid, and the deionized water) is discharged from the first to third lower nozzles 61 to 63. The processing liquid discharged from the first lower nozzle 61 is supplied to the center of the wafer W, the processing liquid discharged from the second lower nozzle 62 is supplied to a portion between the center of the wafer W and a peripheral edge thereof with respect to the radial direction of the wafer W, and the processing liquid discharged from the third lower nozzle 53 is supplied to the peripheral edge of the wafer W.

When the first to third lower nozzles 61 to 63 are arranged at different positions with respect to the radial direction of the wafer W, as in the substrate processing apparatus 60, a sufficiently large amount of processing liquid per unit area of the peripheral edge of the lower surface of the wafer W can be also supplied. Further, the first lower nozzle 61 is arranged nearly on a central axis C of the wafer W held in the spin chuck 1. Therefore, a sufficient amount of processing liquid can be also supplied to the center of the lower surface of the wafer W.

In the substrate processing apparatuses 50 and 60 shown in FIGS. 9 and 10, flow rate adjustment valves may be respectively interposed between the first to third upper nozzles 51 to 53 and the upper processing liquid pipe 54 and between the first to third lower nozzles 61 to 63 and the lower processing liquid pipe 64. In this case, the flow rates of the processing liquids discharged from the first to third upper nozzles 51 to 53 and the first to third lower nozzles 61 to 63 can be individually adjusted.

Although the present invention has been described and illustrated in detail, it is clearly understood that the same is by way of illustration and example only and is not to be taken by way of limitation, the spirit and scope of the present invention being limited only by the terms of the appended claims.

This application correspond to Japanese Patent Application Serial No. 2002-118129 filed with the Japanese Patent Office on Apr. 19, 2002 and Serial No. 2003-47855 filed with the Japanese Patent Office on Feb. 25, 2003, the disclosures of which are incorporated hereinto by reference.

What is claimed is:

1. A substrate processing method comprising:
   a substrate rotating step for rotating a substrate with the substrate held almost horizontally within a chamber,
   a peripheral edge processing step for discharging a processing liquid to a lower main surface of the substrate rotated in the substrate rotating step and causing the processing liquid to flow around to an upper main surface of the substrate at a peripheral edge thereof, around a peripheral end surface of the substrate which is defined between the upper surface and the lower surface of the substrates, to process the peripheral edge of the upper surface of the substrate in the chamber; and
   a both-surface processing step for discharging a processing liquid to both the main surfaces of the substrate rotated in the substrate rotating step to process both the main surfaces of the substrate in the chamber;
   wherein the processing liquid used in the peripheral edge processing step and the processing liquid used in the both-surface processing step include a same etchant, wherein said etchant is used in the both-surface processing step with a lower concentration than the etchant concentration used in the peripheral edge processing step.

2. The substrate processing method according to claim 1, wherein
   the both-surface processing step comprises a post-cleaning step for discharging a cleaning liquid to both the main surfaces of the substrate rotated in the substrate rotating step to clean both the main surfaces of the substrate after the peripheral edge processing step.

3. The substrate processing method according to claim 1, wherein
   the both-surface processing step further comprises
   a deionized water cleaning step for discharging deionized water as the processing liquid to both the main surfaces of the substrate to clean the substrate after the step for discharging the etchant to both the main surfaces of the substrate.

4. The substrate processing method according to claim 1, wherein
   the both-surface processing step comprises
   a pre-cleaning step for discharging a cleaning liquid to both the main surfaces of the substrate rotated in the substrate rotating step to clean the substrate before the peripheral edge processing step.

5. The substrate processing method according to claim 1, wherein
   the substrate processed in the peripheral edge processing step and the both-surface processing step has a metal thin film formed on one of its main surfaces and its end surface.

6. The substrate processing method according to claim 1, wherein the etchant is selected from:
   (i) a solution containing hydrochloric acid, hydrofluoric acid, nitric acid, and hydrogen peroxide;
   (ii) a mixed solution of hydrofluoric acid, nitric acid, and water;
   (iii) a mixed solution of hydrofluoric acid, ozone water, and water;
   (iv) a mixed solution of hydrochloric acid, hydrogen peroxide, and water; and
   (v) buffered hydrofluoric acid solution.

7. The substrate processing method according to claim 1, wherein a thin film is formed on both main surfaces and the end surface of the substrate, and the peripheral processing step includes the step of discharging the etchant toward the lower surface of the substrate so as to etch away the thin film on the lower surface, the end surface and the peripheral edge of the upper surface of the substrate to expose the substrate thereunder.

8. The substrate processing method according to claim 1, wherein a thin film is formed on both main surfaces and the end surface of the substrate, and the peripheral processing step includes the step of discharging the etchant toward the lower surface of the substrate so as to etch the thin film on the lower surface, the end surface and the peripheral edge of the upper surface of the substrate to thin the etched portion of the thin film.

9. A substrate processing method comprising:
   a substrate rotating step for rotating a substrate with the substrate held almost horizontally within a chamber;
   a peripheral edge processing step for discharging a processing liquid to a lower main surface of the substrate rotated in the substrate rotating step and causing the processing liquid to flow around to an upper main surface of the substrate at a peripheral edge thereof, around a peripheral end surface of the substrate which is defined between the upper surface and the lower surface of the substrate, to process the peripheral edge of the upper surface of the substrate in the chamber; and
   a both-surface processing step for discharging a processing liquid to both the main surfaces of the substrate rotated in the substrate rotating step to process both the main surfaces of the substrate in the chamber;
   wherein the processing liquid used in the peripheral edge processing step includes an etchant and the processing liquid used in the both-surface processing step includes a mixed chemical solution different from etchant for removing particles on the substrate.

10. The substrate processing method according to claim 9, wherein the both-surface processing step further comprises a deionized water cleaning step for discharging deionized water as the processing liquid toward both the main surfaces of the substrate to clean the substrate after the step for discharging the chemical for removing particles to both the main surfaces of the substrate.

11. The substrate processing method according to claim 9, wherein the etchant is selected from:
   (i) a solution containing hydrochloric acid, hydrofluoric acid, nitric acid, and hydrogen peroxide;
   (ii) a mixed solution of hydrofluoric acid, nitric acid, and water;
   (iii) a mixed solution of hydrofluoric acid, ozone water, and water;
   (iv) a mixed solution of hydrochloric acid, hydrogen peroxide, and water; and
   (v) buffered hydrofluoric acid solution.

12. The substrate processing method according to claim 9, wherein the chemical for removing particles is selected from:
   (i) a mixed solution of aqueous ammonia, hydrogen peroxide, and water; and
   (ii) a mixed solution of hydrofluoric acid, hydrogen peroxide, and water.

13. The substrate processing method according to claim 9, wherein a thin film is formed on both main surfaces and the end surface of the substrate, and the peripheral processing step includes the step of discharging the etchant toward the lower surface of the substrate so as to etch away the thin film on the lower surface, the end surface and peripheral edge of the upper surface of the substrate to expose the substrate thereunder.

14. The substrate processing method according to claim 9, wherein a thin film is formed on both main surfaces and the end surface of the substrate, and the peripheral processing step includes the step of discharging the etchant toward the lower surface of the substrate so as to etch the thin film on the lower surface, the end surface and peripheral edge of the upper surface of the substrate to thin the etched portion of the thin film.

* * * * *